United States Patent
Nakamura et al.

(10) Patent No.: US 7,319,944 B2
(45) Date of Patent: Jan. 15, 2008

(54) METHOD FOR A PREDICTING A PATTERN SHAPE BY USING AN ACTUAL MEASURED DISSOLUTION RATE OF A PHOTOSENSITIVE RESIST

(75) Inventors: Hiroko Nakamura, Yokohama (JP); Shoji Mimotogi, Yokohama (JP); Yasunobu Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 561 days.

(21) Appl. No.: 10/760,522

(22) Filed: Jan. 21, 2004

(65) Prior Publication Data
US 2004/0236548 A1 Nov. 25, 2004

(30) Foreign Application Priority Data
Jan. 21, 2003 (JP) ............................ P2003-012526

(51) Int. Cl.
*G06G 7/48* (2006.01)
*G06F 17/50* (2006.01)
*H01L 21/00* (2006.01)
*H01L 21/66* (2006.01)

(52) U.S. Cl. .............................. 703/6; 716/19; 716/21; 438/7; 438/16

(58) Field of Classification Search .................... 703/6; 716/19, 21; 438/7, 16
See application file for complete search history.

(56) References Cited

U.S. PATENT DOCUMENTS

| | | | | |
|---|---|---|---|---|
| 5,889,686 A | * | 3/1999 | Mimotogi et al. | ............ 716/19 |
| 6,218,313 B1 | * | 4/2001 | Tomita et al. | ............... 438/758 |
| 6,225,011 B1 | * | 5/2001 | Gotoh et al. | ................... 430/22 |
| 6,280,887 B1 | * | 8/2001 | Lu | ................................. 430/5 |
| 6,319,648 B1 | * | 11/2001 | Reiser | ........................ 430/170 |

FOREIGN PATENT DOCUMENTS

| | | |
|---|---|---|
| JP | 1-188859 | 7/1989 |
| JP | 3-165510 | 7/1991 |

(Continued)

OTHER PUBLICATIONS

Nakamura et al., "Influence of Alkaline Concentration Variation on CD in KrF Resist Development," Journal of Photopolymer Science and Technology (Apr. 20, 2001), pp. 435-438.

(Continued)

*Primary Examiner*—Paul Rodriguez
*Assistant Examiner*—Dwin McTaggart Craig
(74) *Attorney, Agent, or Firm*—Finnegan, Henderson, Farabow, Garrett & Dunner, L.L.P.

(57) ABSTRACT

A computer implemented method for development profile simulation in accordance with an embodiment of the present invention includes calculating optical intensities in a photosensitive resist, calculating a spatial average value of the optical intensities, reading a measured changing ratio of a dissolution rate of the photosensitive resist relating to an alkaline concentration changed by at least one of exposure dose on the photosensitive resist, a position in the thickness direction of the photosensitive resist and an alkaline concentration of developer for the photosensitive resist, obtaining a calculated dissolution rate by using the spatial average value and the measured changing ratio, and predicting a pattern shape of the photosensitive resist from the calculated dissolution rate.

31 Claims, 15 Drawing Sheets

FOREIGN PATENT DOCUMENTS

| | | |
|---|---|---|
| JP | 4-44312 | 2/1992 |
| JP | 10-64792 | 3/1998 |
| JP | 11-214373 | 8/1999 |
| JP | 2000-29217 | 1/2000 |

OTHER PUBLICATIONS

Nakamura et al., "Influence of Alkaline Concentration Variation on CD in KrF Resist Development," Journal of Photopolymer Science and Technology (Apr. 20, 2001), pp. 435-438.

Nakamura et al., "Impact of Development Reaction Products on CD in View of Developer Alkaline Concentration Deviation," SPIE (2001), p. 729.

Notice of Grounds for Rejection Issued by the Japanese Patent Office on May 22, 2007, for Japanese Patent Application No. 2003-012526, and English-language translation thereof.

Official Action Letter issued on Feb. 20, 2007, in the counterpart Japanese Application 2003-012526 and an English abstract thereof.

* cited by examiner

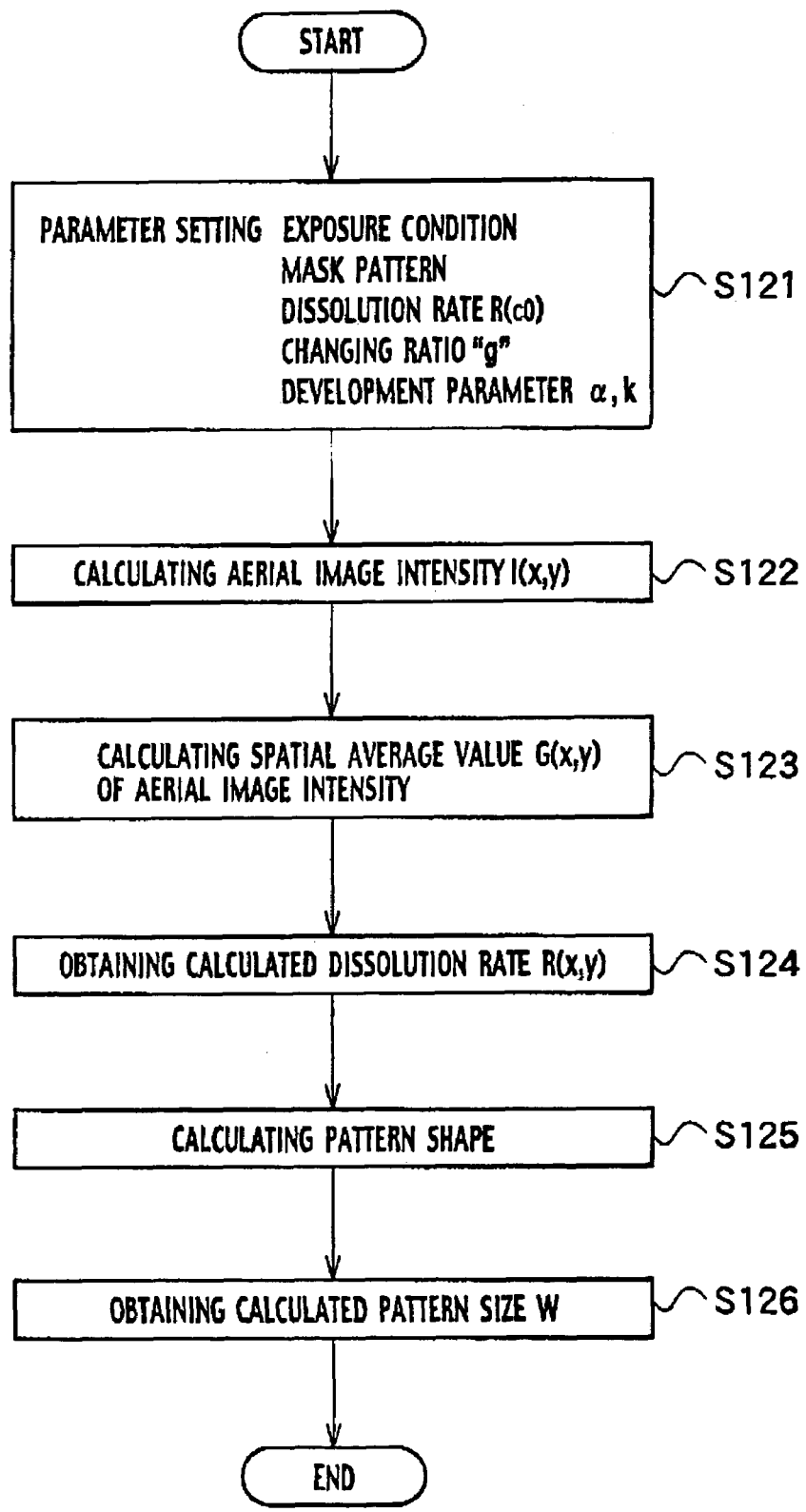

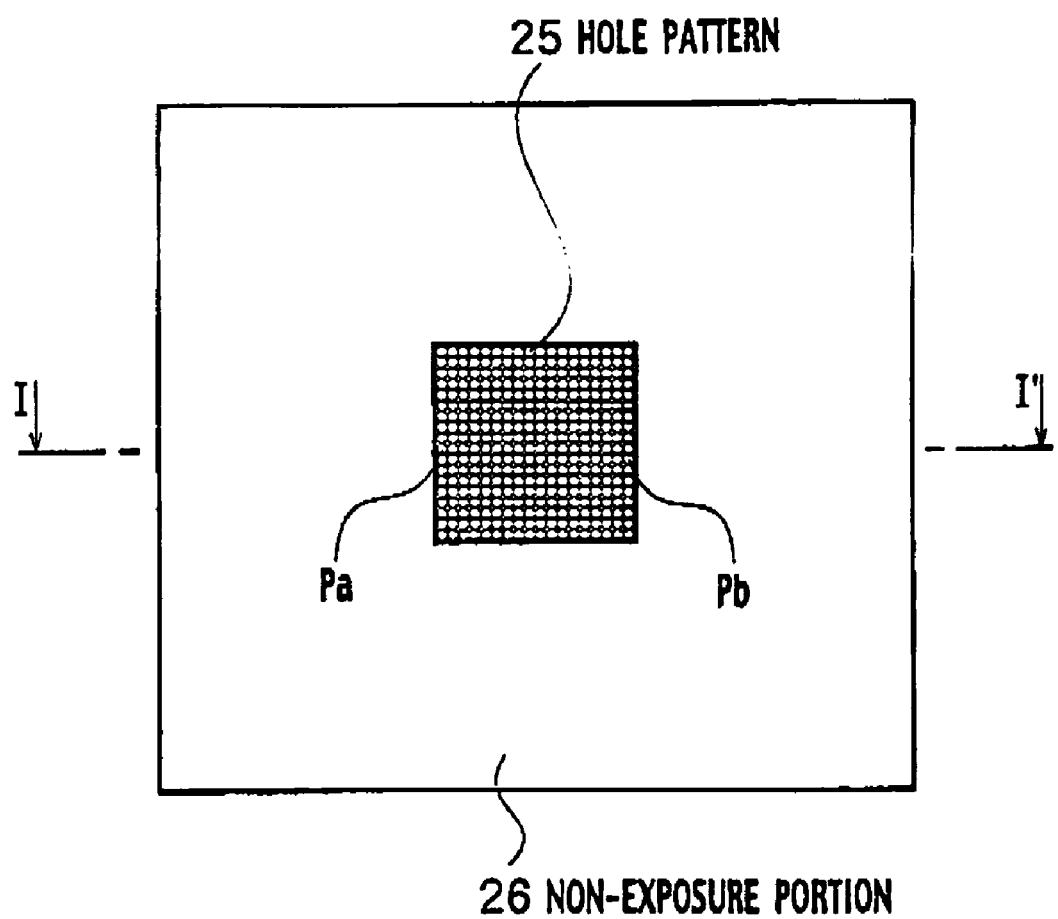

POSITION IN HOLE PATTERN

POSITION IN HOLE PATTERN

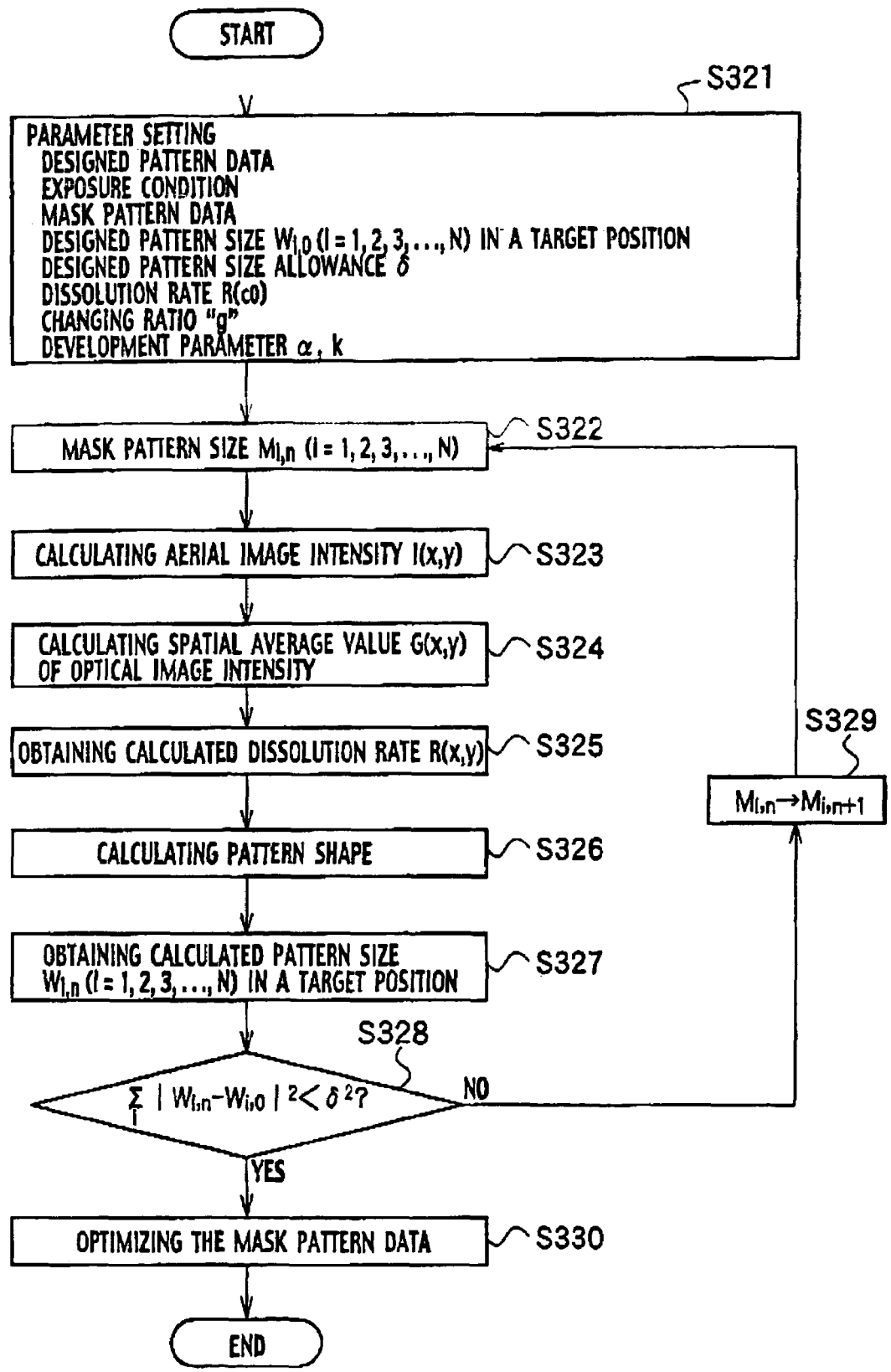

METHOD FOR A PREDICTING A PATTERN SHAPE BY USING AN ACTUAL MEASURED DISSOLUTION RATE OF A PHOTOSENSITIVE RESIST

CROSS REFERENCE TO RELATED APPLICATIONS

This application is based upon and claims the benefit of priority from prior Japanese Patent Applications P2003-012526 filed on Jan. 21, 2003; the entire contents of which are incorporated by reference herein.

BACKGROUND OF THE INVENTION

1. Field of the Invention

The present invention relates to a computer implemented method for development profile simulation, a computer program product for controlling a computer system so as to simulate development profile, and a computer implemented method for mask pattern data correction and in particular to a simulation method to predict a resist pattern shape after exposure and development and a computer program for the simulation method and a mask pattern data correction method using the predicted pattern shape.

2. Description of the Related Art

Generally, a series of processes for manufacturing semiconductor devices includes a lithography process to make a fine pattern on a substrate. In the lithography process, various parameters such as exposure conditions for a projection system and resist process conditions are present to provide a desired resist pattern. For example, the exposure conditions for the projection system include an aperture, a coherence factor, the shape of a light source and a pupil filter. The resist process conditions include the types and thicknesses of resist and anti-reflection films, a post-exposure baking (PEB) temperature, a PEB time, and development time. Furthermore, the parameters for the lithography process also include reticle conditions such as mask pattern size and mask type to provide the desired resist pattern.

As semiconductor devices have continued to shrink in size over time, it is impossible to obtain the desired resist pattern with a desired depth of focus without optimizing the parameters described above, because of a narrow margin of the depth of focus. However, optimizing the parameters for the lithography process by actually manufacturing masks over and over requires a great deal of labor, time and costs. Therefore, in order to reduce the labor, time and costs, a computer simulation is employed to estimate the shape of a developed photosensitive resist. Various resist profile simulation models such as a string model, a ray tracing model and a cell model having been proposed. For the existing resist profile simulation models, it is assumed that the dissolution rate of the photosensitive resist with the developer depend only on the exposure dose, the photosensitive character of the resist and the process condition, or only on the resist pattern shape at a dissolved portion in addition to the above described items.

However, the dissolution rate of the photosensitive resist during the actual development is affected by the change in alkaline concentration. For example, since the resist is developed by the neutralization reaction between an acid unit in the resist and the alkaline in the developer, the alkaline concentration of the developer varies as the neutralization reaction progresses. Therefore, it is difficult to assume that the existing resist profile simulation models accurately predict the resist pattern shape and the resist pattern size.

In Japanese Patent Laid-Open Publication No. Hei 10-64792, a resist profile simulation model that takes into account the change in the alkaline concentration is proposed. According to the proposed resist profile simulation model, the dissolution rate is adjusted in accordance with either the spatial average value of a latent image intensity or a photosensitizer concentration on the assumption that the change in the alkaline concentration is proportional to the amount of dissolved resist around a target resist pattern. The proposed resist profile simulation model assumes that the changing ratio of the dissolution rate is proportional to the amount of the dissolved resist around the target resist pattern, i.e., the change in the alkaline concentration.

However, when the dissolution rate is calculated by an actual measurement, the changing ratio of the dissolution rate is not always proportional to the change in the alkaline concentration. Therefore, the existing resist profile simulation models may fail to converge on a calculation to optimize the parameters. Even when the parameters are optimized, the predicted resist pattern size obtained by the simulation may not be equal to the actual resist pattern size obtained by actual measurement.

Further, when a developer is supplied to the resist, the developer flows in a direction in accordance with the flow velocity. In the case of a scan development method where a developer nozzle is scanned a wafer from one end to the other, the flow of the developer may occur during the development, after a puddle is formed. Since the alkaline concentration of the developer is reduced by the dissolution of the resist, the concentration of the developer varies on the concentration of the resist pattern. Therefore, the actual resist pattern size may differ from the predicted resist pattern size. Consequently, the existing resist profile simulation models also fail to predict the resist pattern size variation due to the flow of the developer.

SUMMARY OF THE INVENTION

An aspect of present invention inheres in a computer implemented method for development profile simulation according to an embodiment of the present invention including calculating optical intensities in a photosensitive resist, calculating a spatial average value of the optical intensities, reading a measured changing ratio of a dissolution rate of the photosensitive resist relating to an alkaline concentration changed by at least one of exposure dose on the photosensitive resist, a position in the thickness direction of the photosensitive resist and an alkaline concentration of developer for the photosensitive resist, obtaining a calculated dissolution rate by using the spatial average value and the measured changing ratio, and predicting a pattern shape of the photosensitive resist from the calculated dissolution rate.

Another aspect of the present invention inheres in the computer implemented method for development profile simulation according to the embodiment of the present invention including calculating optical intensities in a photosensitive resist, calculating a spatial average value of the optical intensities, obtaining a changing ratio of a logarithm of a measured dissolution rate to an alkaline concentration of developer for the photosensitive resist or the changing ratio of the logarithm of the measured dissolution rate to a logarithm of the alkaline concentration of developer for the photosensitive resist, obtaining a calculated dissolution rate by using the spatial average value and the calculated changing ratio of the logarithm of the measured dissolution rate to alkaline concentration of a developer or the calculated changing ratio of the logarithm of the measured dissolution rate to the logarithm of an alkaline concentration of the developer, and predicting a pattern shape of the photosensitive resist by using the calculated dissolution rate.

Yet another aspect of the present invention inheres in the computer implemented method for development profile simulation according to the embodiment of the present invention including calculating optical intensities in a photosensitive resist, calculating a spatial average value of the optical intensities in an area where the photosensitive resist dissolves in initial stage of development, reading a measured changing ratio of a dissolution rate of the photosensitive resist relating to an alkaline concentration, obtaining a calculated dissolution rate by using the spatial average value and the measured changing ratio, and predicting a pattern shape of the photosensitive resist by using the calculated dissolution rate.

Yet another aspect of the present invention inheres in the computer implemented method for development profile simulation according to the embodiment of the present invention including calculating optical intensities in a target position to predict a pattern shape of a photosensitive resist and reference positions moving along development time, calculating spatial average values of the optical intensities in the reference positions, reading a measured changing ratio of a dissolution rate of the photosensitive resist relating to the alkaline concentration, obtaining calculated dissolution rates by using the spatial average values in the reference positions and the measured changing ratio, and predicting the pattern shape of the photosensitive resist in the target position by using the calculated dissolution rates and the optical intensities in the target position.

Yet another aspect of the present invention inheres in a computer program product for controlling a computer system so as to simulate development profile, the computer program product according to the embodiment of the present invention including instructions configured to calculate optical intensities in a photosensitive resist within the computer system, instructions configured to calculate a spatial average value of the optical intensities within the computer system, instructions configured to read a measured changing ratio of a dissolution rate of the photosensitive resist relating to an alkaline concentration changed by at least one of exposure dose on the photosensitive resist, a position in the thickness direction of the photosensitive resist and an alkaline concentration of developer for the photosensitive resist within the computer system, instructions configured to obtain a calculated dissolution rate by using the spatial average value and the measured changing ratio within the computer system, and instructions configured to predict a pattern shape of the photosensitive resist from the calculated dissolution rate within the computer system.

Yet another aspect of the present invention inheres in the computer program product for controlling a computer system so as to simulate development profile, the computer program product according to the embodiment of the present invention including instructions configured to calculate optical intensities in a photosensitive resist within the computer system, instruction configured to calculate a spatial average value of the optical intensities within the computer system, instruction configured to obtain a changing ratio of a logarithm of a measured dissolution rate to an alkaline concentration of developer for the photosensitive resist or the changing ratio of the logarithm of the measured dissolution rate to a logarithm of the alkaline concentration of the developer for the photosensitive resist within the computer system, instruction configured to obtain a calculated dissolution rate by using the spatial average value and the calculated changing ratio of the logarithm of the measured dissolution rate to alkaline concentration of a developer or the calculated changing ratio of the logarithm of the measured dissolution rate to the logarithm of the alkaline concentration of the developer within the computer system, and instruction configured to predict a pattern shape of the photosensitive resist by using the calculated dissolution rate within the computer system.

Yet another aspect of the present invention inheres in the computer program product for controlling a computer system so as to simulate development profile, the computer program product according to the embodiment of the present invention including instruction configured to calculate optical intensities in a photosensitive resist within the computer system, instruction configured to calculate a spatial average value of optical intensities in an area where the photosensitive resist dissolves in initial stage of development within the computer system, instruction configured to read a measured changing ratio of a dissolution rate of the photosensitive resist relating to an alkaline concentration within the computer system, instruction configured to obtain a calculated dissolution rate by using the spatial average value and the measured changing ratio within the computer system, and instruction configured to predict a pattern shape of the photosensitive resist by using the calculated dissolution rate within the computer system.

Yet another aspect of the present invention inheres in the computer program product for controlling a computer system so as to simulate development profile, the computer program product according to the embodiment of the present invention including instruction configured to calculate optical intensities in a target position to predict a pattern shape of a photosensitive resist and reference positions moving along development time within the computer system, instruction configured to calculate spatial average values of the optical intensities in the reference positions within the computer system, instruction configured to read a measured changing ratio of a dissolution rate of the photosensitive resist relating to the alkaline concentration within the computer system, instruction configured to obtain calculated dissolution rates by using the spatial average values in the reference positions and the measured changing ratio within the computer system, and instruction configured to predict the pattern shape of the photosensitive resist in the target position by using the calculated dissolution rates and the optical intensities in the target position within the computer system.

Yet another aspect of the present invention inheres in a computer implemented method for mask pattern data correction according to the embodiment of the present invention including reading a designed pattern data in a photosensitive resist, a mask pattern data, and a measured changing ratio of a dissolution rate of the photosensitive resist relating to an alkaline concentration changed by at least one of exposure dose on the photosensitive resist, a position in the thickness direction of the photosensitive resist and an alkaline concentration of developer for the photosensitive resist, calculating optical intensities in the photosensitive resist by using the mask pattern data, calculating a spatial average value of the optical intensities, obtaining a calculated dissolution rate by using the spatial average value and the measured changing ratio, predicting a pattern shape of the photosensitive resist from the calculated dissolution rate, and optimizing the mask pattern data so as to make the calculated pattern shape similar to the designed pattern data in the photosensitive resist.

Yet another aspect of the present invention inheres in the computer implemented method for mask pattern data correction according to the embodiment of the present invention including obtaining a designed pattern data in a photosensitive resist, a mask pattern data, and a calculated changing ratio of a calculated changing ratio of a logarithm of a measured dissolution rate to an alkaline concentration of developer for the photosensitive resist or the calculated changing ratio of the logarithm of the measured dissolution rate to a logarithm of the alkaline concentration of developer for the photosensitive resist, calculating optical intensities in the photosensitive resist by using the mask pattern data, calculating a spatial average value of the optical intensities, obtaining a calculated dissolution rate by using the spatial average value and the measured changing ratio, predicting a pattern shape of the photosensitive resist from the calculated dissolution rate, and optimizing the mask pattern data so as to make the calculated pattern shape similar to the designed pattern data in the photosensitive resist.

Yet another aspect of the present invention inheres in the computer implemented method for mask pattern data correction according to the embodiment of the present invention including reading a designed pattern data in a photosensitive resist, a mask pattern data, and a measured changing ratio of a dissolution rate of the photosensitive resist relating to an alkaline concentration, calculating optical intensities in the photosensitive resist by using the mask pattern data, calculating a spatial average value of optical intensities in an area where the photosensitive resist dissolves in initial stage of development, obtaining a calculated dissolution rate by using the spatial average value and the measured changing ratio, predicting a pattern shape of the photosensitive resist from the calculated dissolution rate, and optimizing the mask pattern data so as to make the calculated pattern shape similar to the designed pattern data in the photosensitive resist.

Yet another aspect of the present invention inheres in the computer implemented method for mask pattern data correction according to the embodiment of the present invention including reading a designed pattern data in a photosensitive resist, a mask pattern data, and a measured changing ratio of a dissolution rate of the photosensitive resist relating to the spatial average value, calculating optical intensities in a target position of the photosensitive resist and reference positions moving along development time by using the mask pattern data, calculating a spatial average value of the optical intensities in the reference positions, obtaining a calculated dissolution rate by using the spatial average value in the reference positions and the measured changing ratio, predicting a pattern shape of the photosensitive resist by using the calculated dissolution rate and the optical intensities in the target position, and optimizing the mask pattern data so as to make the calculated pattern shape similar to the designed pattern data in the photosensitive resist.

BRIEF DESCRIPTION OF DRAWINGS

FIG. 6 is a flowchart of a method for development profile simulation in accordance with the first embodiment of the present invention;

FIG. 7 is a plan view of a layout pattern in accordance with the first embodiment of the present invention;

FIG. 17 is a flowchart of a method for mask pattern data correction in accordance with the third embodiment of the present invention;

DETAILED DESCRIPTION OF THE INVENTION

Figure 1:
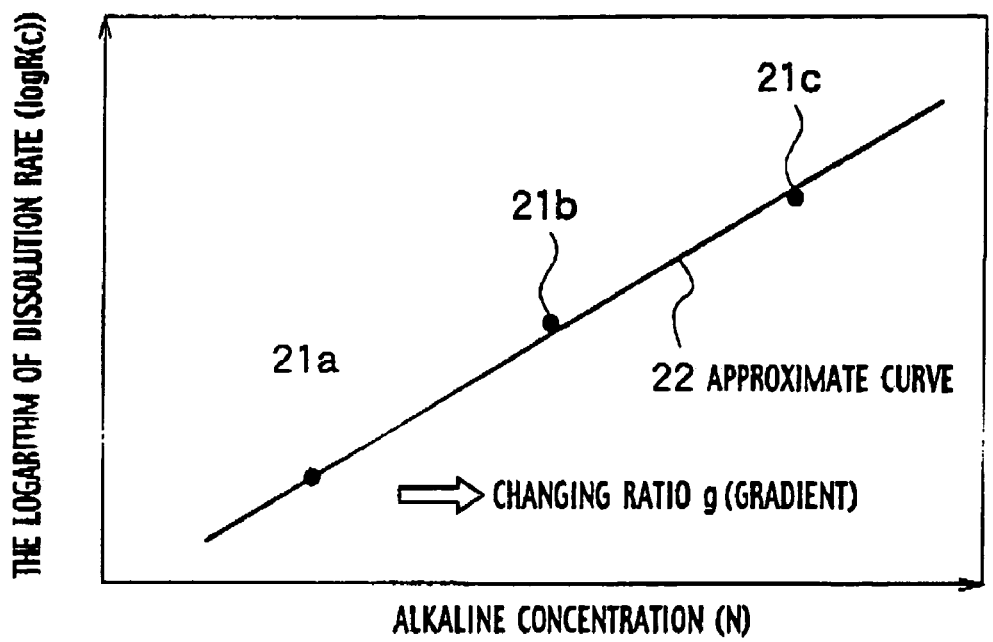
FIG. 1 is a graph that explains a way to obtain a measured changing ratio of a dissolution rate "g"

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Development Model)

Before describing a preferred embodiment of the present invention, a development model for a resist development process is described below. The development of the resist is a neutralization reaction between an acid unit in the resist and the alkaline in a developer. In the development process, the neutralization reaction between the resist and the developer progresses, and the alkaline concentration of the developer decreases as the resist dissolves. The dissolution rate for a highly exposed area of a positive resist or for a low exposed area of a negative resist is very high, for example, 1,000 nm/sec to 10,000 nm/sec. Therefore, such area of the resist dissolves at the initial development stage.

After the initial development stage, a low exposure area such as a pattern edge portion dissolves. Since the resist has already dissolved partially at the initial stage, it is assumed that the developer of a low alkaline concentration makes the low exposure area of the pattern edge dissolve and consequently the final resist pattern size is determined.

In many cases, the relation between the alkaline concentration of the developer and the dissolution rate is not proportional to each other, and as the alkaline concentration increases, the dissolution rate also increases exponentially. Therefore, it is appropriate that the relation between the alkaline concentration and the dissolution rate is given by the approximate equation (1) or (2):

$$\partial\{\log R(c)\}/\partial c = const. \qquad (1)$$

$$\partial\{\log R(c)\}/\partial(\log c) = const. \qquad (2)$$

Here, c is alkaline concentration of the developer, and R(c) is the dissolution rate of the resist. The changing ratio of the logarithm of the dissolution rate R(c) of a photosensitive resist to the alkaline concentration of the developer as shown in equation (3) is used as an example of a changing ratio "g" that shows the changing ratio of the resist dissolution rate relating to the alkaline concentration of the developer. When the initial alkaline concentration of the supplied developer is $c_0$ and the initial dissolution rate is $R(c_0)$, a measured dissolution rate R(c) is given by the equation (4):

$$\partial\{\log R(c)\}/\partial c = g \qquad (3)$$

$$\log R(c) = g(c-c_0) + \log R(c_0) \qquad (4)$$

The quantity of the reacting acid unit of the resist is proportional to the amount of the dissolved resist around the resist pattern. The change of the alkaline concentration is obtained by subtracting the amount of alkaline used by the neutralization reaction from the initial alkaline concentration $c_0$. At a predetermined position (x,y) in the resist, the amount of dissolved resist around the resist pattern, i.e., the amount of alkaline used by the neutralization reaction, is given by the equation (5). The spatial average value G(x, y) is given by the equation (6).

$$c = c_0 - \alpha' G(x, y) \qquad (5)$$

$$G(x,y) = \iint dx'dy' I(x,y) \exp[-\{(x-x')^2+(y-y')^2\}/k^2] \qquad (6)$$

Here, $\alpha'$ is a constant. G(x,y) is the spatial average value of an aerial image intensity and I(x,y) is an aerial image intensity I(x,y).

The relation between the dissolution rate R(x,y) and the spatial average value G(x,y) in the predetermined position (x,y) is given by the equation (7) based on the equations (4) and (5):

$$\log R(x, y) = g\alpha G(x, y) + \log R(c_0) \qquad (7)$$

Here, $\alpha$ is $-\alpha'$, and $g\alpha$ is the changing ratio of the dissolution rate to the spatial average value of the aerial image intensity.

In this case, the aerial image intensity I(x,y) is employed to obtain G(x,y), however, I(x,y) may be replaced with M(x,y) concentration of photoreaction products generated during exposure and PEB.

The changing ratio of the dissolution rate "g" shown in the equation (3) is obtained through measured measurement. For example, by changing the alkaline concentration of the supplied developer, it is possible to measure the dissolution rate corresponding to the alkaline concentration with a dissolution rate monitor (DRM). In FIG. 1, the relation between the alkaline concentration "c" and the logarithm of the dissolution rate R(x,y) is shown and the results obtained by the DRM are plotted. By drawing an approximation curve 22 through a plurality of results 21a to 21c, it is possible to obtain the measured changing ratio "g" (Gradient) of the dissolution rate.

The behavior of the changing ratio of the dissolution rate "g" measured by the DRM depends on the resist type. For example, there is a resist in which the changing ratio of the dissolution rate "g" hardly depends on the exposure dose and resist position in the thickness direction. In this case, the changing ratio "g" obtained by plotting the dissolution rates as shown in FIG. 1 shows almost the same value although exposure dose and resist positions in the thickness direction is changed. The approximation curve 22 in FIG. 1 is linear through out the overall alkaline concentration. Therefore, it is possible to modulate the dissolution rate R(x,y) under the assumption that the changing ratio of the dissolution rate "g" is constant.

Figure 2:
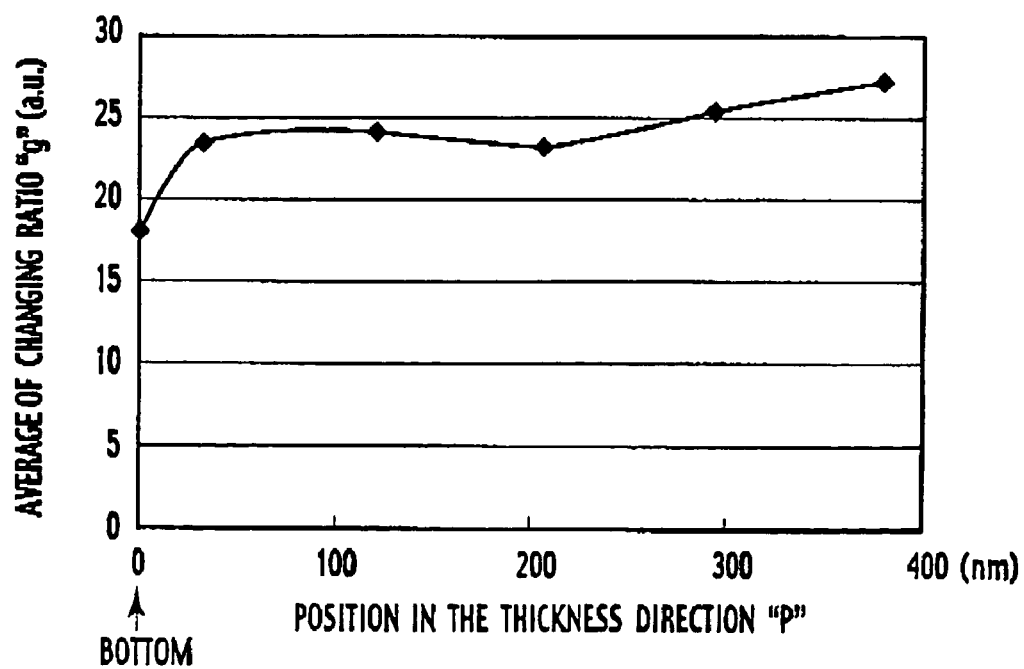
FIG. 2 is a graph that illustrates the relation between a changing ratio of the dissolution rate and a resist position in the thickness direction.

On the other hand, there is a different resist (resist A) in which the changing ratio of the dissolution rate "g" depends on the resist position in the thickness direction, as shown in FIG. 2. In FIG. 2, the changing ratio of the dissolution rate "g" is the average value in terms of exposure dose. Along the horizontal axis, 0 nm indicates the bottom of the resist, and 400 nm indicates the top of the resist. As shown in FIG. 2, the changing ratio of the dissolution rate "g" is constant in the interior of the resist, while the changing ratio of the dissolution rate "g" in the upper and lower portions of the resist varies. Therefore, the changing ratio of the dissolution rate "g" is defined for the upper, the interior and the lower portions of the resist, respectively. In a position "p" inside the resist through the range of 32 nm to 205 nm of the thickness direction, g=23.6 which is an average value defined as the changing ratio of the dissolution rate. In the upper and lower portions of the resist, changing ratio of the dissolution rate "g" is given by the linear approximate equations (8) and (9). In the method for development profile simulation described below, a table is formed containing the changing ratio of the dissolution rates "g" (Gradient) for the individual resist positions in the thickness direction, and the changing ratio of the dissolution rate "g" varies in accordance with the resist position in the thickness direction.

$$g = 0.1673p + 18.08 (p=0\sim32) \qquad (8)$$

$$g = 0.023p + 18.61 (p=205\sim379) \qquad (9)$$

Furthermore, there is another resist in which the changing ratio of the dissolution rate "g" slightly depends on the exposure dose or the alkaline concentration of the developer. In the case where the changing ratio of the dissolution rate "g" depends on the exposure dose, it is possible to define the changing ratio of the dissolution rate "g" by replacing the horizontal axis in FIG. 2 with the exposure dose. Therefore, the changing ratio of the dissolution rate "g" is defined respectively in areas where the changing ratio "g" does not depend on the exposure does and in areas where the changing ratio "g" depends on the exposure dose.

In the case where the changing ratio of the dissolution rate "g" depends on the alkaline concentration "c" of the developer, the inclination slope of the approximation curve 22 shown in FIG. 1 (the changing ratio of the dissolution rate "g") is not constant. In this case, a range of the alkaline concentration "c" is divided into a plurality of segments such as low, middle and high. The inclination slope of the approximation curve 22 for each segment is defined as the changing ratio of the dissolution rate "g". Thereafter, a table is formed containing the changing ratio of the dissolution rate "g" relating to the alkaline concentration "c". It is assumed that the amount of change of the alkaline concentration c due to the development process is proportional to the spatial average value G(x, y) of the aerial image intensity or the concentration of photoreaction products. Therefore, in the method for development profile simulation described below, the dependency on the alkaline concentration of the changing ratio of the dissolution rate "g" may be defined relative to the spatial average value G(x, y). In this case, a range of the spatial average value G(x, y) may be divided into a plurality of segments so that each segment corresponds to the alkaline concentration. For each segment, the table containing the changing ratio of the dissolution rate "g" relating to the spatial average value G(x, y) may be formed.

Figure 3A:
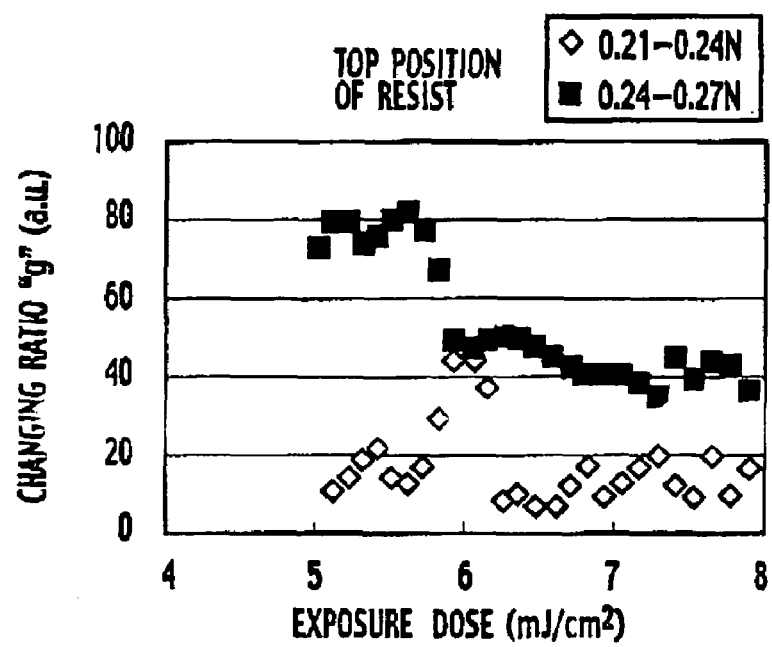
FIG. 3A is a graph that illustrates the dependence of the changing ratio of the dissolution rate on exposure dose in a top position of the resist and FIG. 3B is a graph that illustrates the dependence of the changing ratio of the dissolution rate on exposure dose in a middle position of the resist.
Figure 3B:
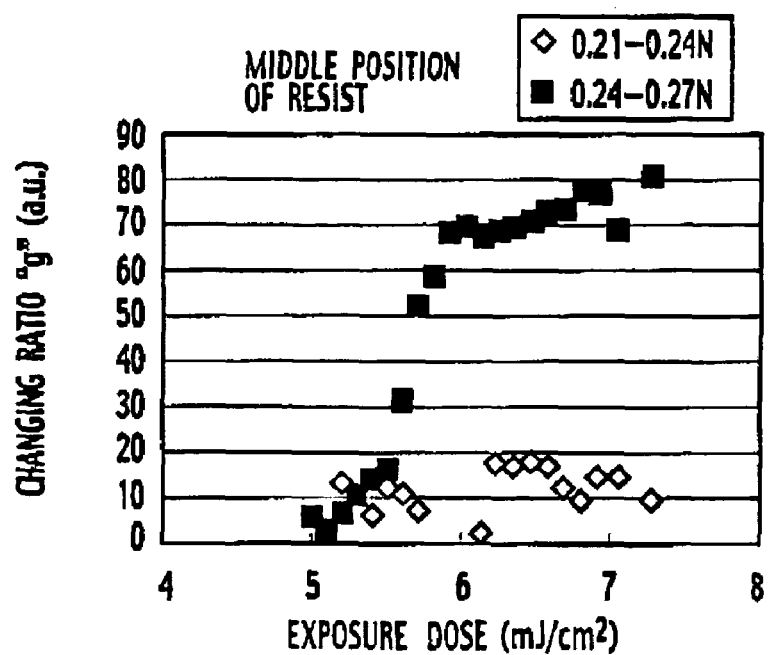

In addition, there is another resist (resist B) in which the changing ratio of the dissolution rate "g" is drastically changed relative to the alkaline concentration of the developer, the exposure dose and the resist position in the thickness direction, as shown in FIGS. 3A and 3B.

In FIGS. 3A and 3B, the changing ratio of the dissolution rate "g" is represented relative to the exposure dose. The alkaline concentration is divided, i.e., 0.21N to 0.24N and 0.24N to 0.27N. It is apparent from FIGS. 3A and 3B that the changing ratio of the dissolution rate "g" greatly depends on the resist position in the thickness direction, the exposure dose and the alkaline concentration of the developer. Based on the results shown in FIGS. 3A and 3B, a table is formed containing the ratio of the logarithm of the dissolution rate to the alkaline concentration as the measured value, as the function of the resist position in the thickness direction, the exposure dose, and the alkaline concentration. Alternatively, the measured values of the changing ratio of the dissolution rate "g"s shown in FIGS. 3A and 3B may be entered in the table. However, considering the measurement error included in the measured value, an average values should be entered as the constant value where a linear approximate is obtained. For example, in FIG. 3A, it is possible to use a constant value for the range where the exposure dose is less than 5.7 mJ and the exposure dose is more than 6.0 mJ while the alkaline concentration is from 0.24N to 0.27N. Further, in FIG. 3A, the linear approximation is conducted for the range where the exposure dose is 5.7 mJ to 6.0 mJ while the alkaline concentration is 0.24N to 0.27N.

The above explanation describes a method to obtain the changing ratio of the dissolution rate "g" calculated by the equation (3). However, the function approximating the relation between the alkaline concentration c and the dissolution rate R(x, y) is not limited to the equation (3). Even though the relation between the alkaline concentration c and the dissolution rate R(x, y) may be represented by an equation other than the equation (3), it is also expected phenomenologically that the changing ratio of the dissolution rate may change in accordance with the resist position in the thickness direction, the exposure dose and the alkaline concentration.

Segregation of a photo-acid generator (PAG) and evaporation of the acid may change the dependence of the changing ratio of the dissolution rate "g" on the resist position in the thickness direction. Some resist is designed so that the PAG is segregated on the surface of a resist in order to form a rectangular resist pattern. For such kind of the resist, since a dissolution inhibition effect due to the PAG differs between the surface and the interior of the resist, the changing ratio of the dissolution rate "g" may depend on the resist position in the thickness direction. It is also well known that, since the acid is evaporated from the surface of the resist, the reduction of acid on the surface of the resist decreases the dissolution rate of the surface of the resist. Therefore, the changing ratio of the dissolution rate "g" may depend on the resist position in the thickness direction.

The variation in the changing ratio of the dissolution rate "g" may also be caused by the fact the resist contains a mixture of different types of resins. In order to maintain the shape of the resist and to reduce roughness, a resist containing a different molecular weight of resin or a different type of resin is generally used. The dissolution probability of a resin is varied in accordance with the number of protecting groups decomposed by exposure. Therefore, in the case where different resins are included in the resist, the dissolution rate of the resin may differ on the exposure dose. Hence, in the case where the changing ratio of the dissolution rate "g" differs for the individual resins, the changing ratio of the dissolution rate "g" of the resist also changes based on the exposure dose. Further, the dissolution probability of the resin in the resist also may vary in accordance with the initial alkaline concentration $c_0$. Therefore, in the case where different resins are present in the resist, the changing ratio of the dissolution rate "g" may change depending on the initial alkaline concentration $c_0$.

Since the dissolution behavior of the resist has not been completely investigated, it is impossible at present time to explain all phenomena where the changing ratio of the dissolution rate "g" corresponding to the change of the alkaline concentration c may change. However, even when the function approximating the relation between the alkaline concentration c and the dissolution rate R(x, y) is changed from equation (3) to another equation (e.g., equation (2)), it is appropriate to change the changing ratio of the dissolution rate "g" corresponding to the change of the alkaline concentration as the function of resist position in the thickness direction, the exposure dose, and the alkaline concentration.

By employing the above described changing ratio of the dissolution rate "g" corresponding to the alkaline concentration c, a method for simulating the resist pattern shape is described below.

First Embodiment

Figure 4:
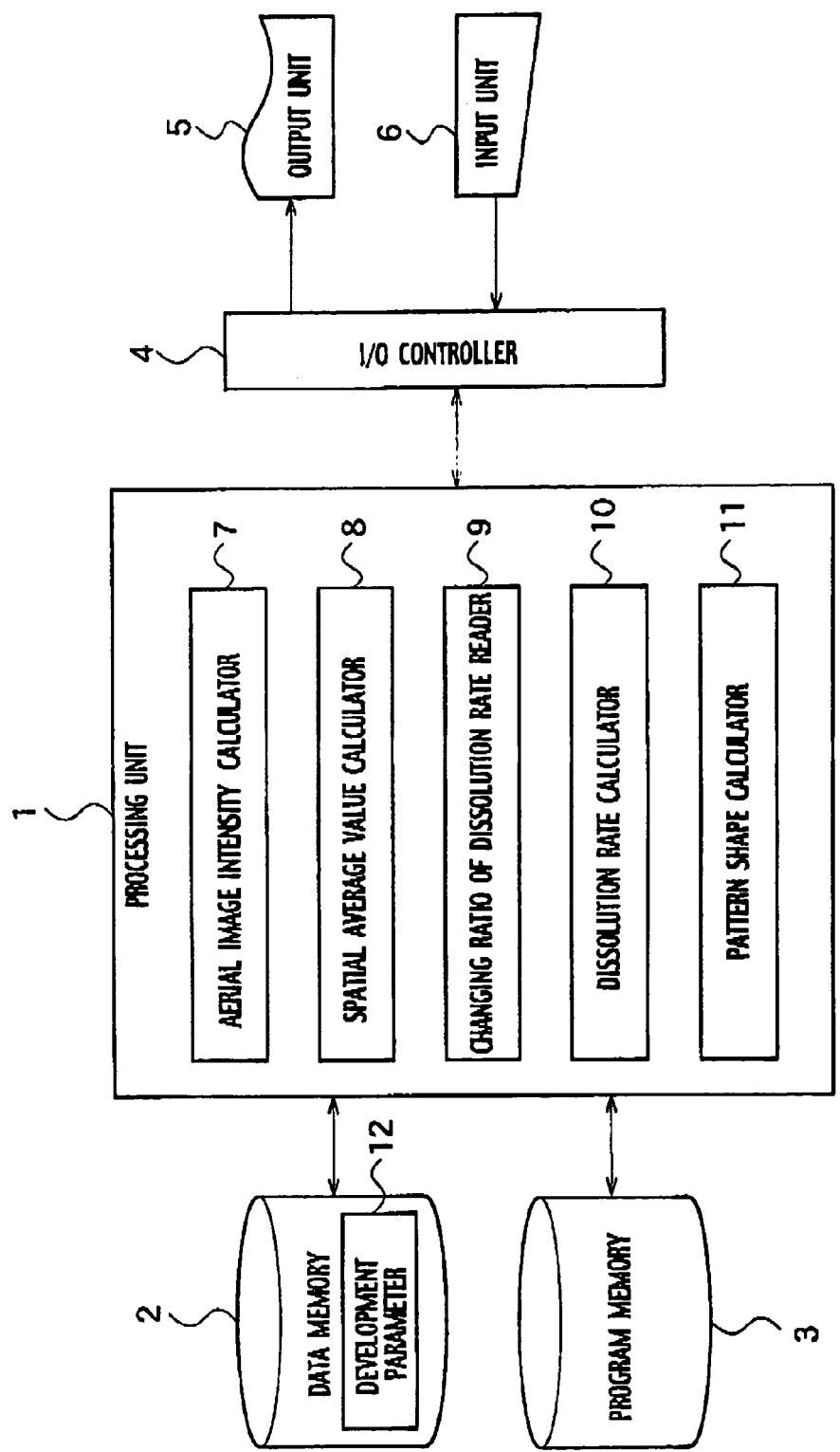
FIG. 4 is a diagram of an apparatus for a profile simulation in accordance with a first embodiment of the present invention.

As shown in FIG. 4, an apparatus for development profile simulation according to a first embodiment of the present invention includes a processing unit 1 having a function for performing the method for development profile simulation, a data memory 2 and a program memory 3 connected to the processing unit 1. The data memory 2 stores various data, such as an exposure condition, mask pattern data and a development parameter 12 which are used to operate the processing unit 1. The program memory 3 stores various types of application software, middleware and an operating system that are used to operate the processing unit 1.

The processing unit 1 includes optical intensities calculator configured to calculate optical intensities of a photosensitive resist, a spatial average value calculator 8 configured to calculate a spatial average value of the optical intensities, a changing ratio of the dissolution rate reader 9 configured to read an exposure condition, mask pattern data, and a measured changing ratio of the dissolution rate of the resist relating to an alkaline concentration, a dissolution rate calculator 10 configured to obtain a calculated dissolution rate using the spatial average value and the measured changing ratio of the dissolution rate, and a pattern shape calculator 11 configured to predict the pattern shape of the resist by using the calculated dissolution rate.

The "optical intensities" includes an aerial image intensity and concentration of photoreaction products. In the first embodiment, the aerial image intensity is employed as the optical intensities. Therefore, the "optical intensities calculator" is an aerial image intensity calculator 7 and the spatial average value calculator 8 calculates the spatial average value of the aerial image intensity. Further, in the first embodiment, the ratio of the logarithm of the measured dissolution rate of the resist to the alkaline concentration is employed as the changing ratio of the dissolution rate "g" of the resist to the alkaline concentration.

The processing unit 1 constitutes one part of the central processing unit (CPU) of an ordinary computer system. The aerial image intensity calculator 7, the spatial average value calculator 8, the changing ratio of the dissolution rate reader 9, the dissolution rate calculator 10 and the pattern shape calculator 11 may be constituted by special hardware, or may be software providing a substantially equivalent function by using the CPU. Although not shown in figure, the apparatus for development profile simulation includes a computer readable program to perform the method for development profile simulation and a main storage device, such as a random access memory (RAM) to temporarily store data processed by the processing unit 1, for example. The data memory 2 and the program memory 3 correspond to auxiliary storage unit such as read-only memories (ROMs) or magnetic disk drives. The processing unit 1 is connected to an input unit 6 for receiving data and instructions entered by an operator through an I/O controller 4, and an output unit 5 for outputting the pattern shape of the resist. A keyboard, a mouse, a light pen and a flexible disk drive are available for the input unit 6, and a display device and a printer are available for the output unit 5.

Figure 5:
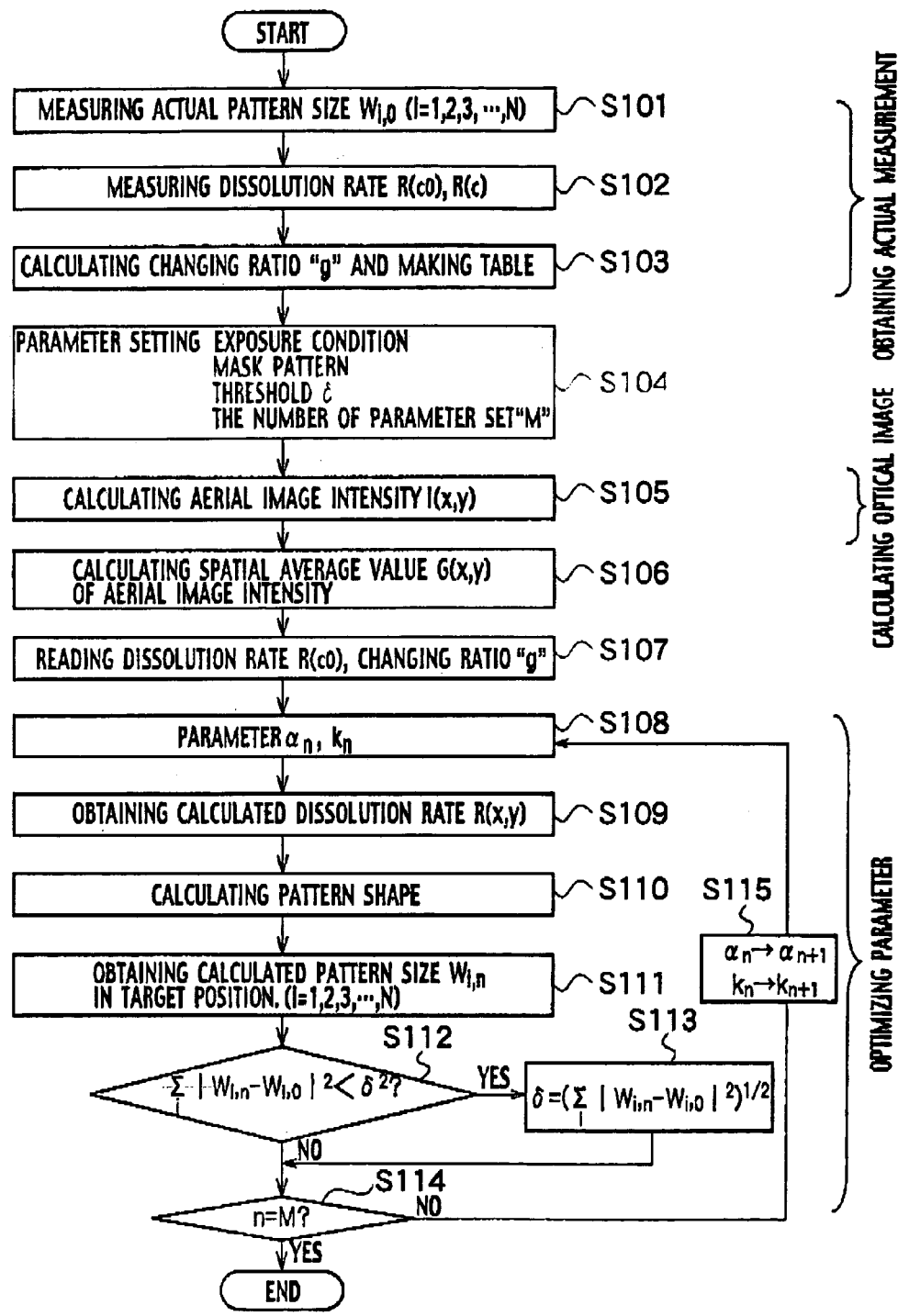
FIG. 5 is a flowchart of a method for optimizing development parameters in accordance with the first embodiment of the present invention.

With reference next to FIGS. 5 and 6, the method for development profile simulation according to the first embodiment of the present invention is described below. In FIG. 5, a method for optimizing development parameters "k" and "α" used for the profile simulation is represented. The development parameters "k" and "α" are used in the equations (6) and (7).

(a) In step S101, N resist patterns are formed, and the N resist pattern sizes are measured. An measured pattern size $W_{i,0}$ (i=1, 2, 3, . . . , N) of the i-th resist pattern is stored in the data memory 2 shown in FIG. 4. The number of resist patterns (N) should be larger than the number of parameters to be optimized. In the first embodiment, N is set to three or more since two development parameters "α" and "k" are optimized.

(b) In step S102, the measured initial dissolution rate $R(c_0)$ of the developer used for pattern formation of the resist, and the measured dissolution rate R(c) during the development are measured. For example, a set of developers having a different alkaline concentration "c" are prepared, and the plural measured dissolution rate R(c) at the alkaline concentration "c" are measured.

(c) In step S103, as described with reference to FIGS. 1 to 3, the ratio of the logarithm of the measured dissolution rate R(c) to the alkaline concentration c is calculated by using the measured dissolution rate R(c) as the measured value of the changing ratio of the dissolution rate "g". Thereafter, a table is formed containing the measured value of the changing ratio of the dissolution rate "g". The measured value of the changing ratio of the dissolution rate "g" is either completely a constant value, or differs in accordance with the alkaline concentration of the developer, the resist position in the thickness direction and the exposure dose. Further, in case that it is possible to obtain the approximate function of the logarithm of the measured dissolution rate R(c) relating to the alkaline concentration "c" of the developer, the measured value of the changing ratio of the dissolution rate "g" is obtained from the fitting function. Since the measured initial dissolution rate $R(c_0)$ depends on the exposure dose, the measured value $R(c_0)$ is obtained as a table or the fitting function. The obtained measured value of the changing ratio of the dissolution rate "g" is stored in the data memory 2.

(d) In step S104, the exposure condition used for the measurement, the condition for the mask pattern, such as the pattern arrangement and the mask size, a threshold value δ that is described below and used as a reference for optimizing the development parameter, and the number of parameter sets "M" to be employed are entered in the processing unit 1. The conditions may be entered by reading data from the data memory 2, or by an operator using the input unit 6. The "exposure condition" used for the actual measurement includes the condition such as NA and σ and the exposure dose. The "parameter set" is a combination of the development parameters "α" and "k" to be optimized. The parameter set containing the first parameter set "$α_1$" and "$k_1$" to the M-th parameter set "$α_M$" and "$k_M$" is prepared.

(e) In step S105, the aerial image intensity calculator 7 calculates an aerial image intensity I(x, y) by using the conditions of exposure and the mask patterns used for the actual measurement. Thereafter, in step S106, the spatial average value calculator 8 calculates a spatial average value G(x, y) of the aerial image intensity by the equation (6) with the calculated aerial image intensity I(x, y). In step S107, the dissolution rate calculator 10 reads the measured changing ratio of the dissolution rate from the data memory 2.

(f) In step S108, the dissolution rate calculator 10 reads the n-th parameter set "$α_n$" and "$k_n$" from the data memory 2. For the first calculation, n is defined as 1. In step S109, the dissolution rate calculator 10 calculates a calculated dissolution rate R(x, y) by using the spatial average value G(x, y) and the measured value of the changing ratio of the dissolution rate "g". Thereafter, in step S110, the pattern shape calculator 11 estimates the resist pattern shape by using the calculated dissolution rate R(x, y) and the aerial image intensity I(x, y) obtained in step S105. In step S111, the pattern shape calculator 11 obtains a calculated pattern size $W_{i,n}$ (i=1, 2, 3, . . . , N) in a target position of the i-th resist pattern that corresponding to the measured pattern size $W_{i,0}$ stored in the data memory 2 at step S101.

(g) In step S112, the pattern shape calculator 11 judges the similarity between the calculated pattern size $W_{i,n}$ and the measured pattern size $W_{i,0}$ based on the threshold value δ. Specifically, if the sum value of the squared difference between the measured pattern size $W_{i,0}$ and the calculated pattern size $W_{i,n}$ for the N resist patterns represented as $\Sigma|W^{i,n}-W_{i,0}|^2$ is smaller than the squared threshold value $δ^2$, step S113 is the next procedure. When $\rho|W_{i,n}-W_{i,0}|^2$ is equal to or larger than the squared threshold value $δ^2$, step S114 is the next procedure. It should be noted that $δ=(\Sigma|W^{i,1}-W_{i,0}|^2)^{1/2}$ is employed as a threshold value for the first calculation (n=1).

(h) In step S113, the pattern shape calculator 11 defines $δ=(\Sigma|W^{i,1}-W_{i,0}|^2)^{1/2}$ as a new threshold. In this case, "$α_n$" and "$k_n$" are stored in data memory 2 as a temporary parameter. In step S114, the pattern shape calculator 11 determines whether "n" is equal to "M". In this case, the n-th parameter set "$α_n$" and "$k_n$" is employed. When "n" is equal to "M", the processing in FIG. 5 is terminated. When "n" is not equal to "M", it is assumed that a parameter set to be calculated remains and step S115 is the next procedure.

(i) In step S115, the pattern shape calculator 11 prepares the n+1-th parameter set "$\alpha_{n+1}$" and "$k_{n+1}$", and performs the processes from steps S108 to S114 using the new parameter set "$\alpha_{n+1}$" and "$k_{n+1}$". The processes from steps S108 to S114 are repeated until "n" is equal to "M".

As described above, by searching for the parameter minimizing the $\Sigma|W_{i,n}-W_{i,0}|^2$ which is sum value of the squared difference between the measured pattern size $W_{i,0}$ and the calculated pattern size $W_{i,n}$, the development parameters "$\alpha$" and "k" are optimized.

With reference next to FIG. 6, the method for development profile simulation method using the optimized development parameters "$\alpha$" and "k" according to the first embodiment is described below.

(A) In step S121, the exposure condition for the resist pattern for which the size is to be predicted, the mask pattern conditions such as the pattern arrangement and the mask size, the measured initial dissolution rate $R(c_0)$, the measured changing ratio of the dissolution rate "g", and the development parameters "$\alpha$" and "k" stored in the data memory 2 are entered in the aerial image intensity calculator 7. The conditions may be entered by an operator using the input unit 6. The exposure condition includes the lighting condition such as NA and $\sigma$ and the exposure dose. The development parameters "$\alpha$" and "k" are the optimized parameters obtained through the processing in FIG. 5.

(B) In step S122, the aerial image intensity calculator 7 calculates the aerial image intensity I(x, y) for a predetermined position (x, y) of the resist with a set condition such as exposure and the mask pattern. In step S123, the average spatial value calculator 8 calculates the average spatial value G(x, y) of the aerial image intensity by the equation (6) with the calculated aerial image intensity I(x, y).

(C) In step S124, the dissolution rate calculator 10 obtains the calculated dissolution rate R(x, y) for the predetermined position of the resist by using the average spatial value G(x, y), the measured initial dissolution rate $R(c_0)$, the measured changing ratio of the dissolution rate "g", and the optimized development parameters "$\alpha$" and "k". In step S125, the pattern shape calculator 11 predicts the pattern shape of the resist by using the calculated dissolution rate R(x, y) and the aerial image intensity I(x, y) obtained in step S122. Finally, in step S126, the pattern shape calculator 11 predicts the calculated pattern size W for the target position.

In the above described method for development profile simulation, the dissolution rate in the predetermined position of the resist varies in accordance with the average spatial value of the optical intensities at the predetermined position of the resist. The measured changing ratio of the dissolution rate used in the method for development profile simulation is defined in accordance with at least one of the exposure dose on the resist, the resist position in the thickness direction, and the alkaline concentration of the developer. Therefore, the changing ratio of the dissolution rate "g" $\alpha$ relating to the average spatial value of the aerial image intensity is also defined in accordance with at least one of the exposure dose on the resist, the resist position in the thickness direction, and the alkaline concentration of the developer. Consequently, the method for development profile simulation reflecting the actual behavior of the development is realized. Further, the method for development profile simulation according to the first embodiment makes it possible to accurately predict the shape and the size of the resist pattern.

In the method shown in FIG. 5, the threshold value $\delta$ is updated in order to minimize $\Sigma|W_{i,n}-W_{i,0}|^2$ as the result of the squared difference between the measured pattern size $W_{i,0}$ and the calculated pattern size $W_{i,n}$ for each pattern. However, so long that the $\Sigma|W_{i,n}-W_{i,0}|^2$ is minimized, a method is not limited to that shown in FIG. 5.

The above explanation describes the the method for development profile simulation using the aerial image intensity I(x, y) as the optical intensities. However, the first embodiment is not limited to the simulation using the aerial image intensity. It is also possible to use "the concentration M(x,y) of the photoreaction products" reacted during exposure and a PEB as the optical intensities instead of the aerial image intensity I(x, y). Therefore, the method for development profile simulation using the concentration M(x,y) of the photoreaction products is described below.

Figure 9:
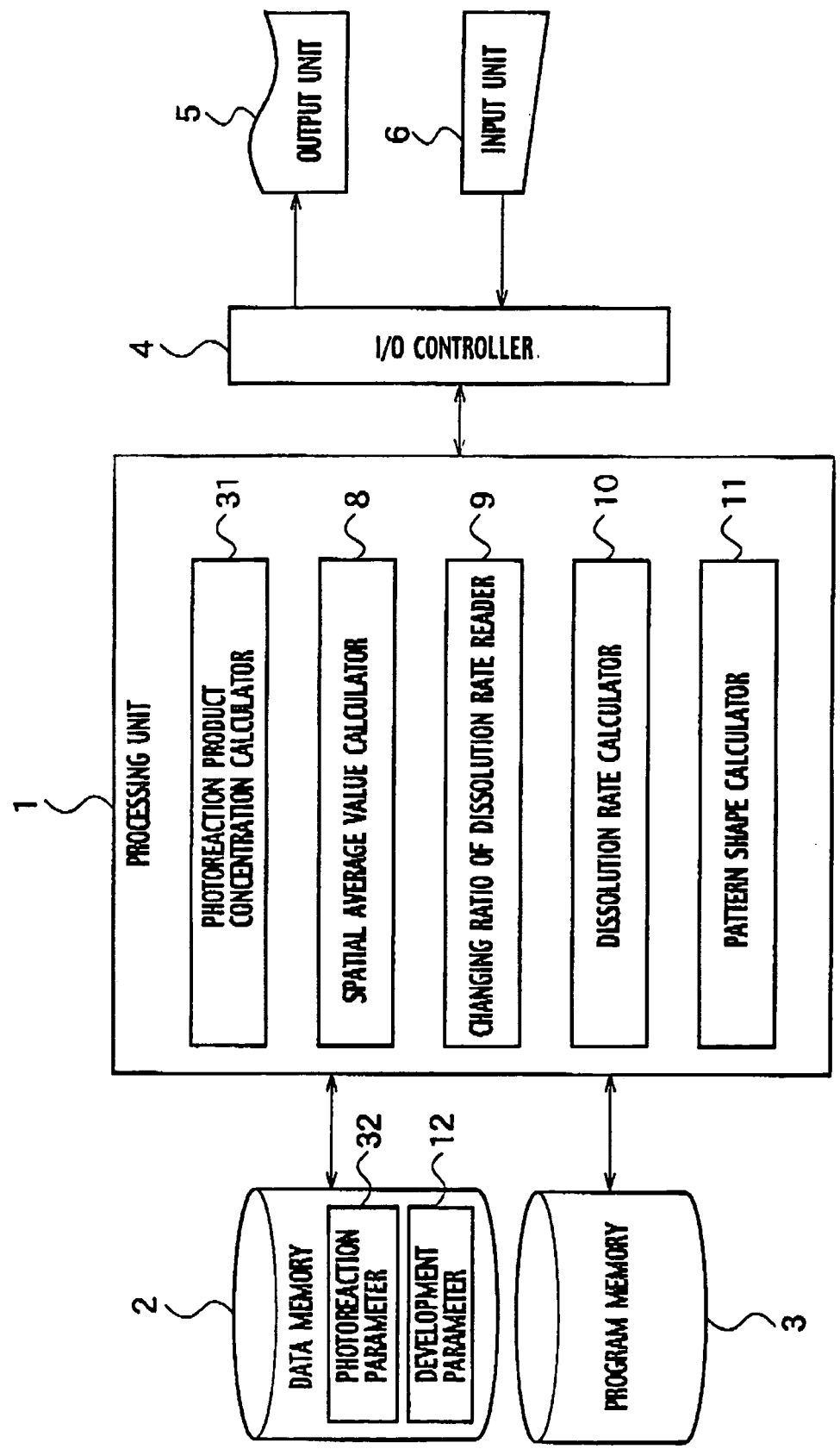
FIG. 9 is a block diagram of the apparatus for the profile simulation.

With reference now to FIG. 9, an apparatus for development profile simulation according to the first embodiment of the present invention includes the processing unit 1, the data memory 2 and the program memory 3 connected to the processing unit 1. The data memory 2 stores various data, such as the exposure condition, mask pattern data, the development parameter 12 and a photoreaction parameter 32 which are used to operate the processing unit 1.

The processing unit 1 includes an photoreaction products concentration calculator 31, a spatial average value calculator 8 configured to calculate a spatial average value of the concentration M(x,y) of the photoreaction products, the changing ratio of the dissolution rate reader 9 configured to read the ratio of the dissolution rate of the resist to the alkaline concentration of the developer which changes relating to at least one of the exposure dose, the resist position in the thickness position and the alkaline concentration of the developer, a dissolution rate calculator 10 configured to obtain a calculated dissolution rate using the spatial average value and the measured changing ratio of the dissolution rate, and a pattern shape calculator 11 configured to predict the pattern shape of the resist by using the calculated dissolution rate.

The processing unit 1 constitutes one part of the central processing unit (CPU) of an ordinary computer system. The photoreaction product concentration calculator 31, the spatial average value calculator 8, the changing ratio of the dissolution rate reader 9, the dissolution rate calculator 10 and the pattern shape calculator 11 may be constituted by special hardware, or may be software providing a substantially equivalent function by using the CPU. The processing unit 1 is connected to the input unit 6 for receiving data and instructions entered by an operator through the I/O controller 4, and the output unit 5 for outputting the pattern shape of the resist.

Figure 10:
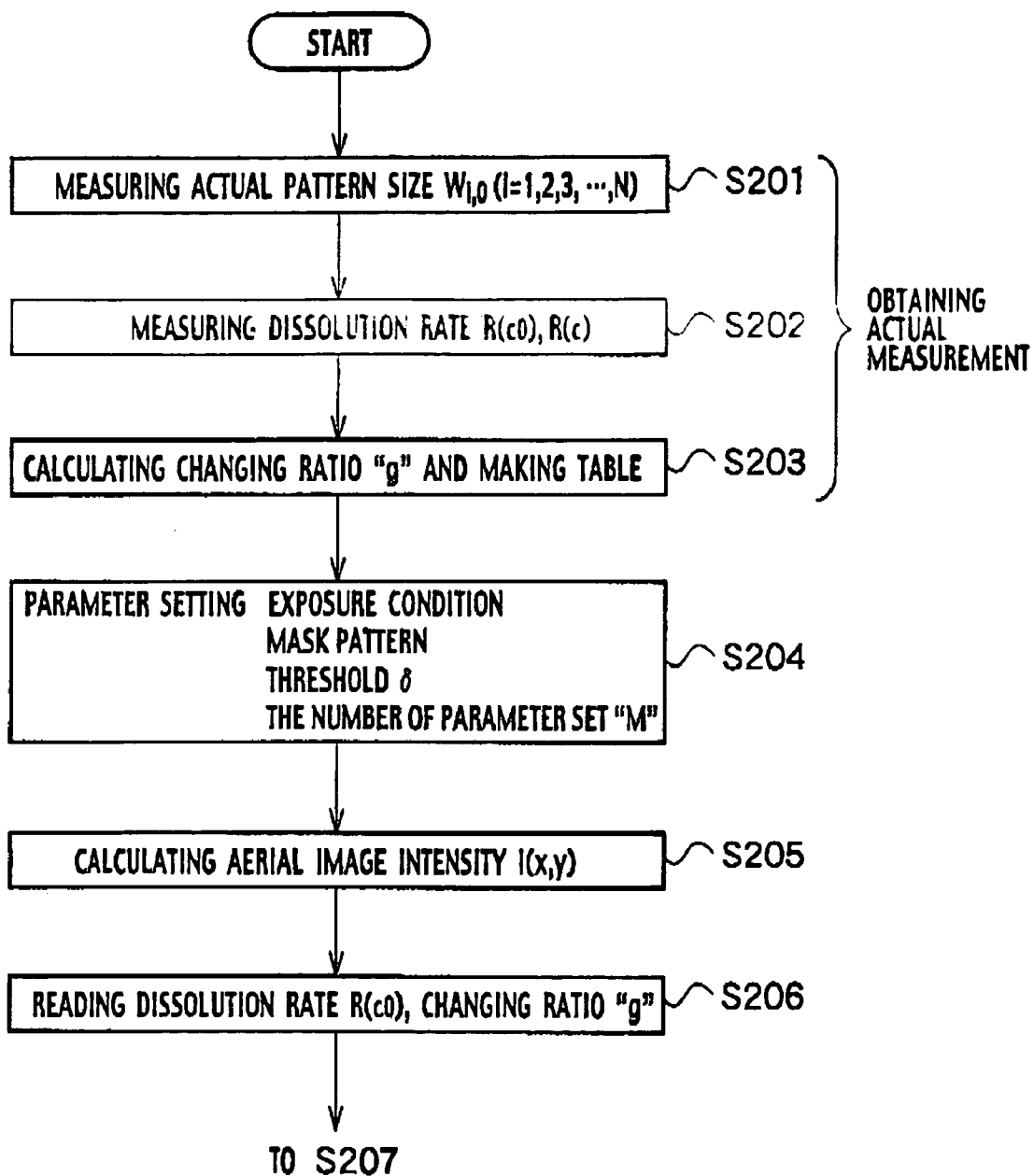
FIG. 10 is a flowchart of a method for optimizing development parameters and photoreaction parameters in accordance with the first embodiment of the present invention.
Figure 11:
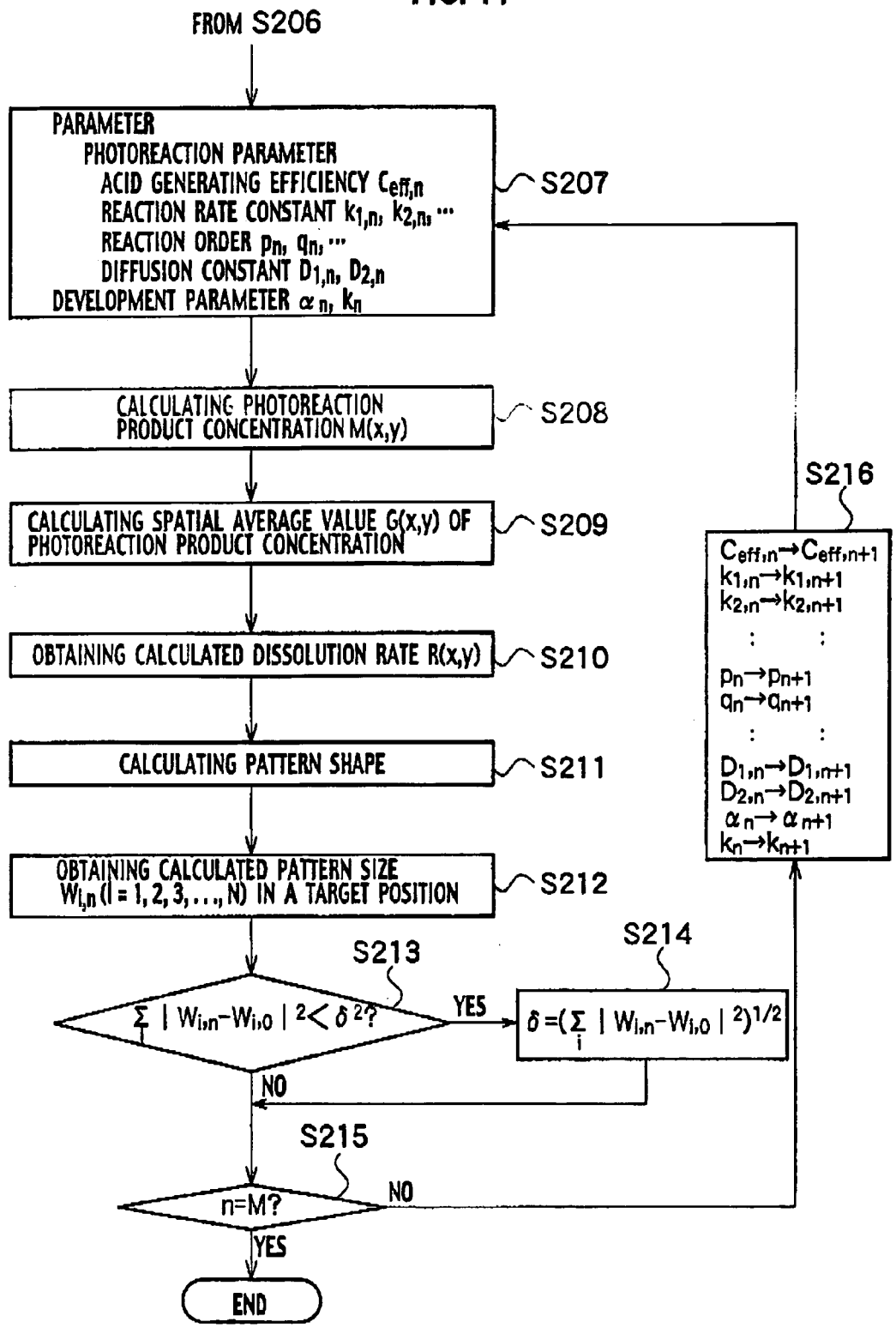
FIG. 11 is a second flowchart of a method for optimizing development parameters and photoreaction parameters in accordance with the first embodiment of the present invention.
Figure 12:
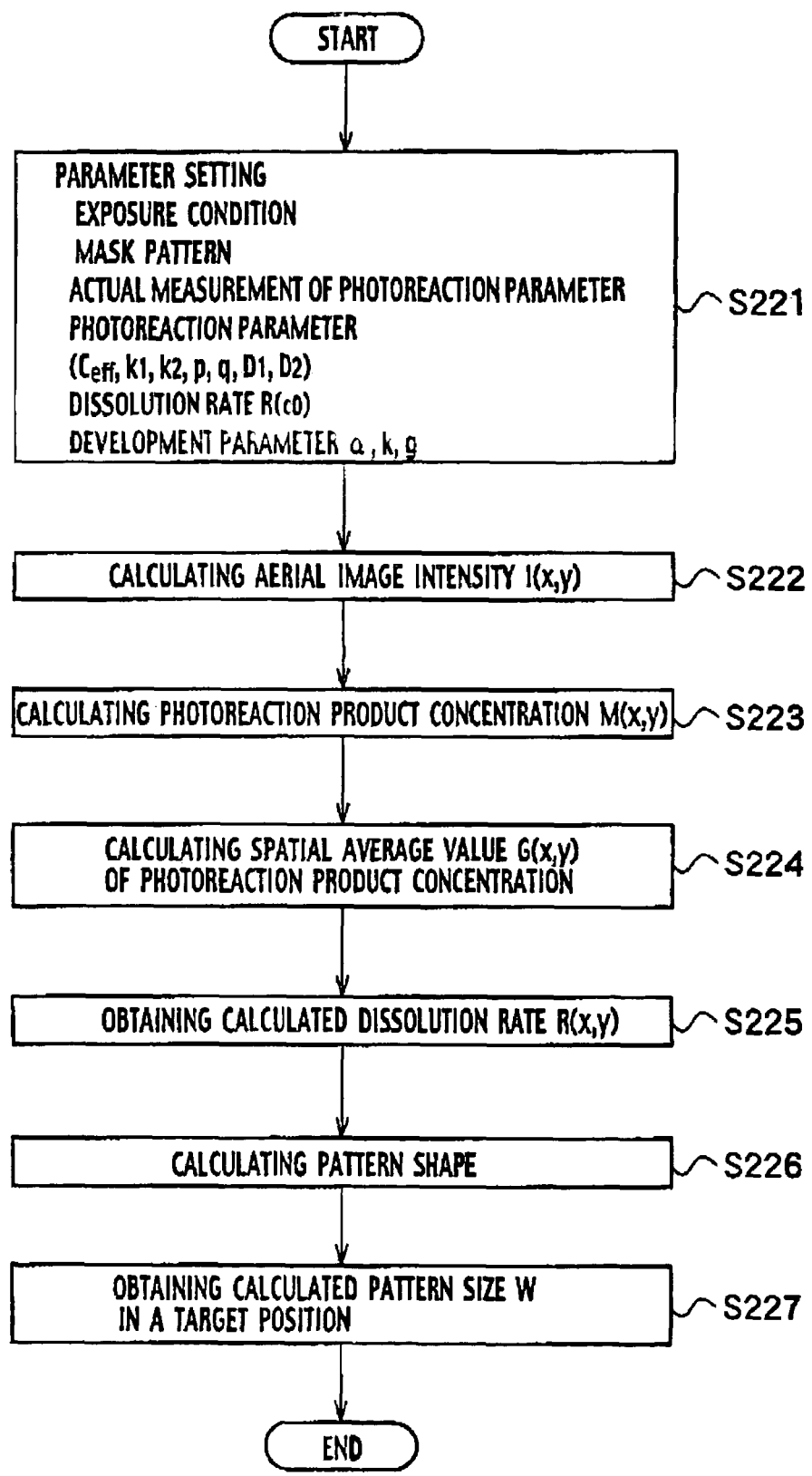
FIG. 12 is a flowchart of the method for development profile simulation in accordance with the first embodiment of the present invention.

With reference next to FIGS. 10, 11 and 12, the method for development profile simulation using the apparatus for development profile simulation shown in FIG. 9 according to the first embodiment of the present invention is described below. In FIGS. 10 and 11, a method for optimizing development parameters "k" and "$\alpha$" used for the method for development profile simulation is represented.

In the case where the aerial image intensity is used as the optical intensities, the development parameters "k" and "$\alpha$" are optimized through the processing in FIG. 5. However, in the case where the concentration of the reaction product is used as the optical intensities, the photoreaction parameters are also optimized by using a photoreaction model. Some measured photoreaction parameter is measurable, but other measured photoreaction parameter is not measurable. Therefore, not only development parameters but also photoreaction parameters are also optimized. The photoreaction by the exposure is different between a novolac resist and a chemically amplified resist. Therefore, the photoreaction model is different between the novolac resist and the chemically amplified resist. Further, since the photoreaction of the chemically amplified resist is complicated, the photoreaction and the parameter affecting the pattern size is to be selected depending on the type of the resist. In FIGS. 10 and 11, acid generating efficiency, reaction rate constant, reaction order, and diffusion constant are selected as the photoreaction parameter.

(a) In step S201, N resist patterns are formed, and the N resist pattern sizes are measured. The measured pattern size $W_{i,0}$ (i=1, 2, 3, ..., N) of the i-th resist pattern is stored in the data memory 2 shown in FIG. 9. The number of resist patterns (N) should be larger than the number of parameters to be optimized. When the number of the optimized parameters is T, N is set to τ+1 or more.

(b) In step S202, the measured initial dissolution rate $R(c_0)$ of the developer used for pattern formation of the resist, and the measured dissolution rate R(c) during the development are measured. For example, a set of developers having a different alkaline concentration "c" are prepared, and the plural measured dissolution rate R(c) at the alkaline concentration "c" are measured.

(c) In step S203, as described with reference to FIGS. 1 to 3, the ratio of the logarithm of the measured dissolution rate R(c) to the alkaline concentration c is calculated by using the measured dissolution rate R(c) as the measured value of the changing ratio of the dissolution rate. Thereafter, a table is formed containing the measured value of the changing ratio of the dissolution rate "g". The measured value of the changing ratio of the dissolution rate "g" is either completely a constant value, or differs in accordance with the alkaline concentration of the developer, the resist position in the thickness direction and the exposure dose. Further, in the case that it is possible to obtain the approximate function of the logarithm of the measured dissolution rate R(c) relating to the alkaline concentration "c" of the developer, the measured value of the changing ratio of the dissolution rate "g" is obtained from the fitting function. Since the measured initial dissolution rate $R(c_0)$ depends on the exposure dose, the measured value $R(c_0)$ is obtained as the table or the fitting function. The obtained measured value of the changing ratio of the dissolution rate "g" is stored in the data memory 2.

(d) In step S204, the exposure condition used for the actual measurement, the condition for the mask pattern, such as the pattern arrangement and the mask size, a threshold value δ that is described below and used as a reference for optimizing the development parameter, and the number of parameter sets "M" to be employed are entered in The photoreaction product concentration calculator 31. The conditions may be entered by reading data from the data memory 2, or by an operator using the input unit 6. The "exposure condition" used for the actual measurement includes the condition such as NA and σ and the exposure dose. The "parameter set" is a combination of the development parameters "α", "k" and photoreaction parameter to be optimized. The parameter set containing the first parameter set to the M-th parameter set is prepared.

(e) In step S205, The photoreaction product concentration calculator 31 calculates the aerial image intensity I(x, y) by using the conditions entered in step s204. Thereafter, in step S206, The photoreaction product concentration calculator 31 reads the initial measured dissolution rate $R(c_0)$ stored in the data memory and the ratio of the logarithm of the measured dissolution rate to the change of the alkaline concentration given by the equation (3).

(f) In step S207, The photoreaction product concentration calculator 31 reads the n-th parameter set from the data memory 2. The n-th parameter set includes the photoreaction parameter, development parameter "$\alpha_n$" and "$k_n$" The photoreaction parameter includes the acid generating efficiency $C_{eff,n}$, ..., the reaction rate constant $k_{1,n}$, $k_{2,n}$, ..., the reaction order $p_n$, $q_n$, ..., and the diffusion constant $D_{1,n}$, $D_{2,n}$, ... For the first calculation, n is defined as 1. In step S208, The photoreaction product concentration calculator 31 calculates the concentration M(x, y) of the photoreaction products using the aerial image intensity I(x, y) and the n-th parameter set.

(g) In step S209, the spatial average value calculator 8 calculates a spatial average value G(x, y) by the equation (6) with the calculated concentration M(x, y) of the photoreaction products. Here, I(x, y) in the equation (6) is replaced with M(x, y). In step S210, the dissolution rate calculator 10 calculates the calculated dissolution rate R(x, y) by using the spatial average value G(x, y) and the measured changing ratio of the dissolution rate of the resist. Thereafter, in step S211, the pattern shape calculator 11 estimates the resist pattern shape by using the calculated dissolution rate R(x, y) and the concentration M(x, y) of the photoreaction products obtained in step S208. In step S212, the pattern shape calculator 11 obtains a calculated pattern size $W_{i,n}$ (i=1, 2, 3, ..., N) in a target position of the i-th resist pattern that corresponding to the measured pattern size $W_{i,0}$.

(h) In step S213, the pattern shape calculator 11 judges the similarity between the calculated pattern size $W_{i,n}$ and the measured pattern size $W_{i,0}$ based on the threshold value δ. Specifically, if the sum value of the squared difference between the measured pattern size $W_{i,0}$ and the calculated pattern size $W_{i,n}$ for the N resist patterns represented as $\Sigma|W^{i,n}-W_{i,0}|^2$ is smaller than the squared threshold value $\delta^2$, step S214 is the next procedure. When $\Sigma|W_{i,n}-W_{i,0}|^2$ is equal to or larger than the squared threshold value $\delta^2$, step S215 is the next procedure. It should be noted that $\delta=(\Sigma|W^{i,1}-W_{i,0}|^2)^{1/2}$ is employed as a threshold value for the first calculation (n=1).

(i) In step S214, the pattern shape calculator 11 defines $\delta=(\Sigma|W^{i,n}-W_{i,0}|^2)^{1/2}$ as a new threshold. In this case, the photoreaction parameter $C_{eff,n}$, $k_{1,n}$, $k_{2,n}$, $p_n$, $q_n$, $D_{1,n}$, $D_{2,n}$ and the development parameter "α" and "k" are stored in the data memory 2 as the temporary parameters.

In step S215, the pattern shape calculator 11 determines whether "n" is equal to "M". When "n" is equal to "M" which is the number of the parameters set, the processing in FIGS. 10 and 11 is terminated. When "n" is not equal to "M", it is assumed that a parameter set to be calculated remains and step S216 is the next procedure.

(j) In step S216, the pattern shape calculator 11 prepares the n+1-th parameter set, and performs the processes from steps S207 to S215 using the new parameter set. The processes from steps S207 to S215 are repeated until "n" is equal to "M".

As described above, by searching for the parameter set minimizing the $\Sigma|W_{i,n}-W_{i,0}|^2$ which is sum value of the squared difference between the measured pattern size $W_{i,0}$ and the calculated pattern size $W_{i,n}$, the development parameters "α" and "k" and the photoreaction parameter are optimized.

It should be noted that the photoreaction model and the photoreaction parameters are depend on the type of the resist and the appropriate reaction model is selected for each type of the resist.

With reference next to FIG. 12, the method for development profile simulation using the optimized development parameters "α" and "k" and the photoreaction parameters according to the first embodiment is described below.

(A) In step S221, the exposure condition for the resist pattern for which the size is to be predicted, the mask pattern conditions such as the pattern arrangement and the mask size, the measured initial dissolution rate $R(c_0)$, the measured changing ratio of the dissolution rate "g", and the optimized development parameters "α" and "k", and the optimized photoreaction parameters in the data memory 2 are entered in the aerial image intensity calculator 7. The conditions may be entered by an operator using the input unit 6. The exposure condition includes the condition such as NA and σ and the exposure dose. The development parameters "α" and "k" and the photoreaction parameters are the optimized parameters obtained through the processing in FIGS. 10 and 11.

(B) In step S222, the photoreaction product concentration calculator 31 calculates the aerial image intensity $I(x, y)$ for a predetermined position $(x, y)$ of the resist with a set condition such as exposure and the mask pattern. In step S223, The photoreaction product concentration calculator 31 calculates the photoreaction product concentration $M(x,y)$ with the calculated aerial image intensity $I(x, y)$ and the photoreaction parameters optimized through the processing in FIGS. 10 and 11.

(C) In step S224, the spatial average value calculator 8 calculates the spatial average value $G(x, y)$ of the aerial image intensity by using the equation (6) with the calculated concentration $M(x, y)$ of the photoreaction products. Here, $I(x, y)$ in the equation (6) is replaced with $M(x, y)$. In step S224, the dissolution rate calculator 10 calculates the calculated dissolution rate $R(x, y)$ for the predetermined position of the resist by using the average spatial value $G(x, y)$, the measured initial dissolution rate $R(c_0)$, the measured changing ratio of the dissolution rate "g", and the optimized development parameters "α" and "k". (D) In step S226, the pattern shape calculator 11 predicts the pattern shape of the resist by using the calculated dissolution rate $R(x, y)$ and the aerial image intensity $I(x, y)$ obtained in step S223. Thereafter, in step S227, the pattern shape calculator 11 predicts the calculated pattern size W for the target position.

In the above described method for development profile simulation, the dissolution rate in the predetermined position of the resist varies in accordance with the average spatial value of the optical intensities at the predetermined position of the resist. The measured changing ratio of the dissolution rate "g" used in the method for development profile simulation is defined in accordance with at least one of the exposure dose on the resist, the resist position in the thickness direction, and the alkaline concentration of the developer. Therefore, the changing ratio of the dissolution rate "g" α relating to the average spatial value of the photoreaction product concentration is also defined in accordance with at least one of the exposure dose on the resist, the resist position in the thickness direction, and the alkaline concentration of the developer. Consequently, the method for development profile simulation reflecting the actual behavior of the development is realized. Further, the method for development profile simulation according to the first embodiment makes it possible to accurately predict the shape and the size of the resist pattern.

In the method shown in FIG. 11, the threshold value δ is updated in order to minimize $\Sigma |W_{i,n} - W_{i,0}|^2$ as the result of the squared difference between the measured pattern size $W_{i,0}$ and the calculated pattern size $W_{i,n}$ for each pattern. However, so long that the $\Sigma |W_{i,n} - W_{i,0}|^2$ is minimized, a method is not limited to that shown in FIG. 11.

Next, the results obtained by several types of simulation for various specific resist types are described below. Prior to describe the result by applying the method for development profile simulation in accordance with the first embodiment to a line pattern of the resist, the results obtained by a method disclosed in Japanese Patent Laid-Open Publication No. Hei 10-64792 is described below.

In the publication of Japanese Patent Laid-Open Publication No. Hei 10-64792, the changing ratio of the dissolution rate is proportional to the average spatial value of the intensity for a latent image or a photosensitizer concentration. Further, the changing ratio of the dissolution rate is assumed as a constant without actual measurement, and is optimized as one of the development parameters. Since the changing ratio of the dissolution rate is defined as being proportional to the average spatial value of the latent image intensity or the photosensitizer concentration, the equation (10) is used instead of the equation (7).

$$R(x, y) = R(c_0)[1 + \gamma \{G(x, y) - G_0\}] \qquad (10)$$

Under the condition, "γ", "k" and "$G_0$" are defined as the development parameters and are optimized through the processing in FIG. 5. In this case, the changing ratio "g" is neither actually measured nor read from the data memory 2. A 1:1 line and space (L&S) pattern from 0.13 μm to 0.2 μm and the exposure condition, for example, the cyclic illumination with NA=0.6, σ=0.75 and ε=⅔ are employed as the condition to optimize the parameters. Further, a resist of 300 nm thicknesses on an anti-reflection film is used.

However, when the "resist C" is used, the development parameters is not converged and consequently it is impossible to execute the optimizing method shown in FIG. 5. Therefore, the resist profile simulation is executed by using the development parameters "k" and "gα" as the development parameters with the equation (7). Note that in this case, the changing ratio "g" is also neither actually measured nor read from the data memory 2. Thereafter, the parameters is converged and optimized.

Next, the final pattern size is predicted in the case of changing space width of the line pattern of 0.13 μm using the resist C. The result shows that the line width is formed smaller at the position where the ratio of the line width to the space width is 1:2 or 1:3 than at the position where ratio of the line width to the space width is 1:1 when the line width of the mask is constant and the space width is varied. Furthermore, the line width increases as the space width becomes larger. Such a behavior of development is common for almost all types of the resist. When the simulation is executed by using the development parameter optimized by actually using the resist C to obtain the final line size, not only such a behavior of development is reproduced, but also a predicted pattern size is similar to the measured pattern size.

However, actual measurement of the changing ratio of the dissolution rate "g" of the resist C represented by the equation (3) reveals that the resist C has character the changing ratio of the dissolution rate "g" does not depend on the concentration of the developer, the exposure dose and the resist position in the thickness direction. The measured changing ratio of the dissolution rate "g" is also substantially equal to the optimal value obtained by the simulation.

Therefore, using the equations (3) and (7) may be appropriate. Further, in case of the resist having the substantially constant changing ratio of the dissolution rate "g" relating to the concentration of the developer, the exposure dose and the resist position in the thickness direction, it is possible to optimize the changing ratio "g" as the one of the development parameter obtained through the processing in FIG. 5 without actual measurement of the changing ratio "g".

However, the above method is not available for all conditions. According to the method, it is possible to optimize the development parameters "α" and "k" for the "resist A" shown in FIG. 2. The resist A has the changing ratio of the dissolution rate "g" varying at the resist position in the thickness direction. However, it is impossible to accurately predict the final pattern size with the optimized parameter when the space width with the line width of 0.13 μm is changed. Consequently, though the above described method reproduces the behavior of the line width when the space width is changed, the predicted pattern size is not equal to the measured pattern size. Therefore, when the value of the changing ratio "g" is defined for each of the upper portion, the interior and the lower portion of the resist as described above, the predicted pattern size reproduces the measured pattern size.

In addition, it is impossible to converge the development parameters by the above method when the "resist B" shown in FIGS. 3A and 3B having the changing ratio of the dissolution rate "g" drastically changing in accordance with the alkaline concentration of the developer, the exposure dose and the resist position in the thickness direction. It is assumed that the development parameters is not converged because the changing ratio of the dissolution rate "g" of the resist B drastically changes as shown in FIGS. 3A and 3B when the ratio is measured. Therefore, after the changing ratio of the dissolution rate "g" is measured, a table is formed containing the measured changing ratio "g" for each conditions such as the concentration of the developer, the exposure dose and the resist position in the thickness direction. Thereafter, the development parameters "α" and "k" are optimized by using the value in the table of the changing ratio of the dissolution rate "g". As the result, the convergence value for the development parameters is obtained. Thereafter, the final pattern size is predicted by changing the space width with the line pattern of 0.13 μm. Consequently, the behavior of the line width when the space width changes is reproduced. Further, the predicted pattern size is substantially equal to the measured pattern size. Therefore, forming the table containing the actually measured changing ratio of the dissolution rate "g" and executing the optimization of the parameters and the pattern resist profile simulation provide precise prediction of the pattern size.

In the first embodiment, the ratio of the logarithm of the measured dissolution rate R(c) to the alkaline concentration is employed as the changing ratio of the dissolution rate of the resist as shown by the equation (3). However, the equation representing the changing ratio of the dissolution rate is not limited to the equation (3). For example, as shown by the equation (2), when the logarithm of the measured dissolution rate R(c) is proportional to the logarithm of the alkaline concentration, the changing ratio of the dissolution rate "g" may be given by the equation (11).

$$\partial\{\log R(c)\}/\partial\{\log c\}=g \qquad (11)$$

Further, the dissolved amount of the resist around the resist pattern is obtained as the average spatial value G(x, y) of the aerial image intensity I(x, y) in the first embodiment as shown by the equation (6). However, the average spatial value G(x, y) is not limited to the description. When the positive resist is used, an approximation function H(x, y) given by the equation (12) may also be available.

$$H(x,y)=\int\int dx'dy' I(x,y) f(a) \exp[-\{(x-x')^2+(y-y')^2\}/k^2] \qquad (12)$$

Here, f(a) is 1 when I(x, y)≧a, while f(a) is 0 when I(x, y)<a. This is based on the following reason. Since the exposure dose sufficient to form the resist pattern makes the dissolution rate of the resist very high such as several thousands nm/sec, an area exposed in a certain amount or more is dissolved in the initial stage of development. Thereafter, the development of an area for determining the size of the pattern edge portion is initiated. Therefore, it is assumed that, as the high exposure area of the resist dissolves, the alkaline concentration is changed, and the developer having a reduced alkaline concentration makes the pattern edge portion dissolve. Consequently, so long as the area where the aerial image intensity I(x, y) is equal to or larger than a constant value (a), the other area where the aerial image intensity I(x, y) is less than the constant value (a) can be neglected. As the result, it is possible to reduce the calculation time. On the other hand, in case of the negative resist, f(a) is 0 when I(x, y)≧a, while f(a) is 1 when I(x, y)<a in the equation (12).

When the approximation function H(x, y) given by the equation (12) is used, the concentration M(x, y) of the photoreaction products reacted by the exposure and the PEB is also available instead of I(x, y). In this case, it is possible to optimize the constant value (a) in the equation (12) for the simulation as a development parameter as well as α and k.

As described above, the method for development profile simulation in accordance with the first embodiment makes it possible to make a phenomenon model such that the large area dissolves at the initial development stage, the alkaline concentration of the developer is changed, and the developer makes the low exposure area dissolve, so that the final size is determined. Therefore, method for development profile simulation according to the first embodiment makes it possible to reduce the calculation time without losing the accuracy.

Especially, the spatial average value calculated in the area where the aerial intensities or the concentration of the photoreaction products is either equal to or larger than the constant value or less than the constant value is used. Therefore, it is possible to provide the phenomenon model that the large area dissolving at the initial development stage changes the alkaline concentration of the developer and the developer makes the low exposure area dissolve and the final pattern size is determined. Consequently, it is possible to reduce the calculation time while the accuracy is maintained.

The method for development profile simulation according to the first embodiment of the present invention is capable of being expressed as descriptions of a series of processing or instructions for a computer system. Therefore, the method for development profile simulation is capable of being formed as a computer program product to execute multiple functions of the CPU in the computer system. "The computer program product" includes, for example, various writable mediums and storage devices incorporated or connected to the computer system. The storage device is capable of being expressed as the program storage unit 3 shown in FIG. 4. Writing the computer program into the program storage unit 3 is also available. Consequently, the computer program of the method for development profile simulation is executed by the processing unit 1 in accordance with predetermined procedures. The writable mediums include a memory device, a magnetic disc, an optical disc and any devices that record computer programs.

The computer system may have a flexible disk drive and a CD-ROM drive in front. The computer program product as the flexible disk or the CD-ROM is inserted into each disk drive and executes the method for development profile simulation. A ROM as a semiconductor memory for example used for game cassette and a cassette tape as a magnetic tape are also available for the computer program product by connecting a drive unit to the computer system.

(Comparison with An Actual Value)

As an example that the method for development profile simulation according to the first embodiment is applied, the method for predicting pattern size for a chip having the same pattern arranged in array is described below. In FIG. 7, a layout pattern includes a non-exposure resist portion 26 and a hole pattern 25 surrounded by the non-exposure resist portion 26. The hole pattern 25 has a plural hole patterns arranged in array. The positive resist of 300 nm thickness coated on the anti-reflection film on the wafer. The diameter of the hole in the hole pattern is 0.2 μm and the ratio of the diameter of the hole to the space is 1:1. While the developer is supplied through a linear nozzle, the wafer is rotated to apply the developer uniformly. The annular illumination with NA=0.68, σ=0.75 and ε=⅔ are used as the exposure condition.

Figure 8A:
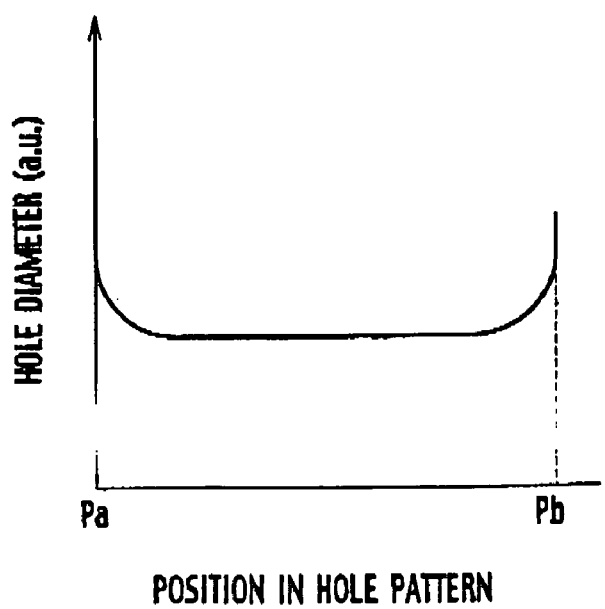
FIG. 8A is a graph that illustrates a actual hole diameter relating to position and FIG. 8B is a graph that illustrates a calculated hole diameter relating to the position.
Figure 8B:
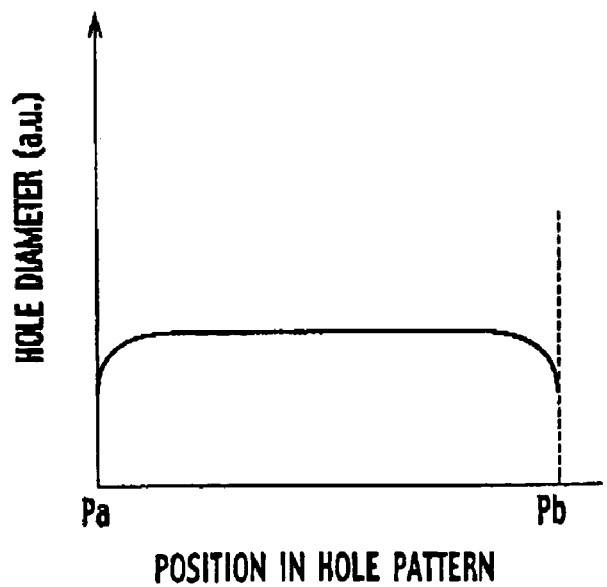

With reference next to FIGS. 8A and 8B, "Pa" and "Pb" along the horizontal axes correspond to the position of the hole pattern shown in FIG. 7. As shown in FIG. 8A, for the measured resist pattern, the hole diameter in peripheral position of the hole pattern 25 such as Pa and Pb is larger than the hole diameter in central region where the hole patterns are concentrated. However, when the resist profile simulation is executed by only using the aerial image intensity as shown in FIG. 8B, the hole diameter in Pa and Pb is smaller than the hole diameter in the central region where the patterns are concentrated.

The large area adjacent to the points Pa and Pb is non-exposure area. When the developer is supplied to the rotated wafer through the linear nozzle, there is almost no movement of the developer and only the diffusion of the dissolved material occurs. Therefore, since the consumption of alkaline in the developer around Pa and Pb is smaller than the consumption of alkaline around the central region of the hole pattern portion 25, the regions around Pa and Pb are developed with the developer of high alkaline concentration. Therefore, it is assumed that the final hole diameter is increased.

Therefore, the changing ratio of the dissolution rate "g" of the resist D is measured and the method for development profile simulation according to the first embodiment is executed. The development parameters are optimized by changing the ratio of the hole diameter to the space while maintaining the hole diameter of 0.2 μm. As the result, it is possible to reproduce the measured hole diameter shown in FIG. 8A by the simulation. Consequently, it reveals that the method for development profile simulation according to the first embodiment predicts the pattern size difference in the chip even when the density of the chip patterns is distributed.

Second Embodiment

A method for predicting the size difference due to flow of developer with profile simulation is described in a second embodiment. When the developer is being supplied, or after the developer puddle is formed, flow of the developer may occur depending on the process condition. In this case, the flow velocity of the developer is higher than the diffusion rate of the dissolved reaction product or the alkaline. With the normal exposure dose, the dissolution rate on the large area is very high such as several thousands nm/sec. Further, the area exposed certain exposure dose or more dissolves in a moment. Therefore, when the flow of the developer occurs, a target pattern is affected by the alkaline concentration of the developer flowing into the pattern and the dissolution rate is changed.

Figure 13:
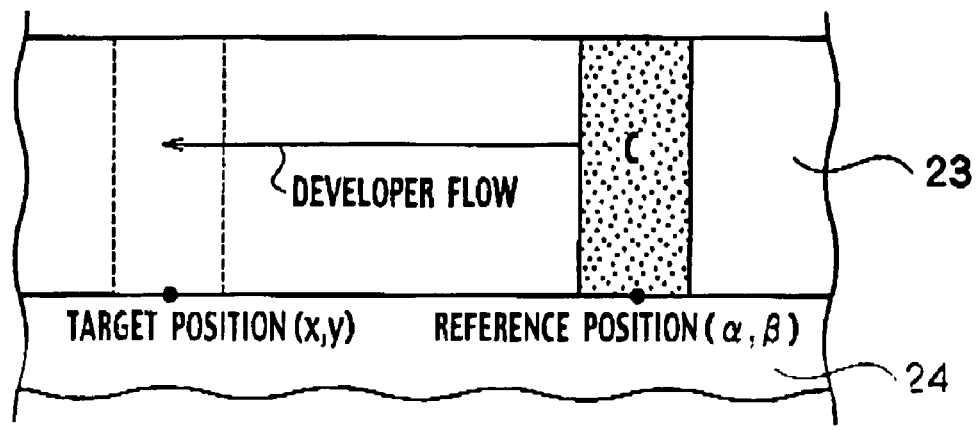
FIG. 13 is a sectional diagram that illustrates a flow of the developer on the resist in accordance with the first embodiment of the present invention.

With reference now to FIG. 13, the developer 23 is supplied to the resist 24 coated on the substrate uniformly. The developer 23 flows at a constant velocity from reference position $A(\alpha,\beta)$ to a target position $X(x, y)$. At time "t", the developer 23 flows from the reference position A to the target position X where a pattern shape is calculated. At the reference position A, since the developer 23 reacts with the resist 24, the alkaline concentration $c_0$ of the supplied developer 23 is reduced to the alkaline concentration c. Therefore, the alkaline concentration c of the developer 23 at the target position $X(x, y)$ depends on the dissolved resist amount around the reference position $A(\alpha,\beta)$. Thus, the reference position $A(\alpha,\beta)$ on the resist 24 for calculating the aerial image intensity and the average spatial value of the intensity is defined in different position to the target position $X(x, y)$ on the resist 24 for predicting the pattern shape. Further, the reference position $A(\alpha,\beta)$ for calculating the aerial image intensity and the average spatial value of the intensity be moved in accordance with the flow velocity of the developer 23 and the development time. Thereafter, reference position optical intensities $I(\alpha,\beta)$ and the average spatial value G of the intensity are calculated at the reference position $A(\beta,\beta)$. The reference position $A(\alpha,\beta)$ is calculated as a function $(\alpha(t), \beta(t))$ for time t.

For a positive resist, the area exposed certain amount or more dissolves in a moment. The dissolved resist amount around the reference position A during a constant time of the initial development stage is calculated under assumption that the dissolved resist amount is proportional to the average spatial value of the aerial image intensity. $H(x, y)$ given by the equation (12) is used as a concentration modulation function instead of $G(\alpha,\beta)$ given by the equation (6). Therefore, the equation (14) where variables x and y in the equation (12) are replaced with α and β is used.

$$H(\alpha, \beta) = \int\int dx'dy' I(\alpha, \beta) f(a) \exp[-\{(\alpha-x')^2 + (\beta-y')^2\}/k^2] \quad (14)$$

Here, $f(a)$ is 1 when $I(\alpha,\beta) \geq a$, while $f(a)$ is 0 when $I(\alpha,\beta) < a$.

On the other hand, in the case of the negative resist, since the area exposed less than the certain amount is dissolved, $f(a)$ is 0 when $I(\alpha,\beta) \geq a$, while $f(a)$ is 1 when $I(\alpha,\beta) < a$ in the equation (14).

Similar to the first embodiment, the ratio of the logarithm of the measured dissolution rate $R(c)$ of the resist to the alkaline concentration "c" of the developer is given by the equation (3) where the logarithm of the measured dissolution rate $R(c)$ of the resist to the alkaline concentration "c" of the developer. When $c_0$ is given as the initial alkaline concentration of the supplied developer, the measured dissolution rate $R(c)$ is obtained by the equation (4). Therefore, the calculated dissolution rate $R(x, y)$ is obtained by the equation (15). For each time "t", the calculated dissolution rate $R(x, y)$ is given by the equation (15).

$$\log R(x,y) = \log R(c_0) + g\eta H(\alpha(t), \beta(t)) \quad (15)$$

The development parameters are optimized through the processing in FIG. 5. In this case, the development parameter includes a constant exposure dose (a) and a development parameter η instead of the development parameter α. The measured pattern size used for the optimization may be actual measurement under the condition where the development is performed with flowing developer. The actual measurement under the condition where the flow of the developer does not occur is also used as an alternative.

Subsequently, the profile simulation is executed to predict the pattern size by using the optimized parameters and the method shown in FIG. 6. In this case, the aerial image intensity I(x, y) is replaced with the reference position optical intensities I(α,β). H(α,β) given by the equation (14) is employed as the average spatial value. The calculated dissolution rate R(x, y) is obtained by the equation (15). Further, the aerial image intensity in the target position X and the calculated dissolution rate obtained by the equation (15) are employed to predict the pattern shape.

Figure 14:
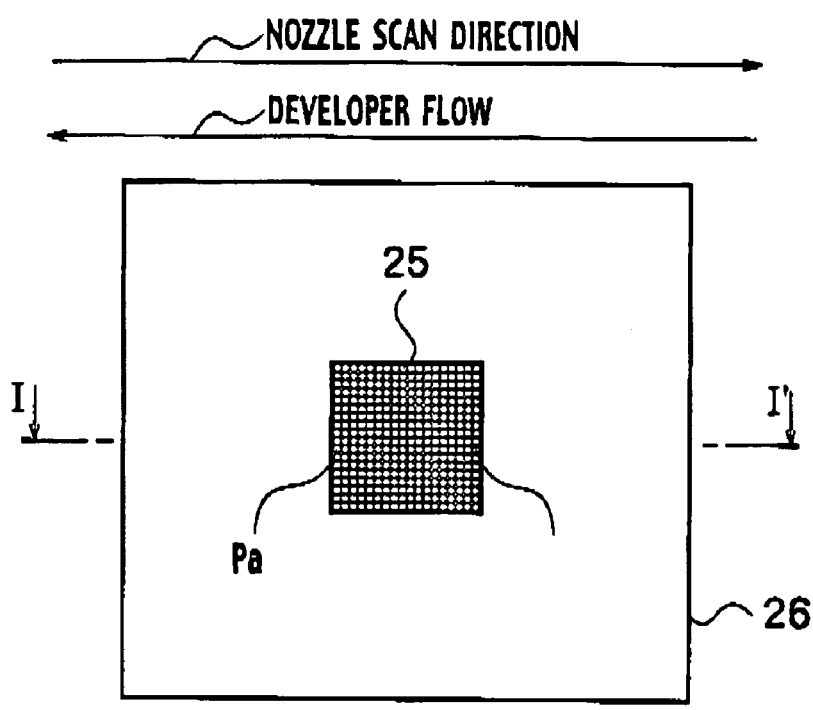
FIG. 14 is a plan view of a layout pattern in accordance with a second embodiment of the present invention.

The predicted pattern size obtained by the profile simulation and the measured pattern size are compared by using the mask pattern same as the hole pattern shown in FIG. 7. With reference to FIG. 14, the mask pattern according to the second embodiment includes an non-exposure resist area 26 and a hole pattern 25 similar to the hole pattern shown in FIG. 7. In the hole pattern 25, a plural hole patterns are regularly arranged in array. Further, a scan development method which supplies the developer by scanning a linear nozzle from one end to the other end of the wafer in a nozzle scanning direction is shown in FIG. 14 is used. Since the scan development method does not rotate the wafer, the scan development method is an effective development method for a wafer having a large diameter, a large photo mask and a liquid crystal display. However, while the flow of the developer is substantially negligible in the case where the wafer is rotated, the supplied developer gradually moves and the uniformity is deteriorated in the scan development method. The direction of the flow of the developer is opposite at 180 degrees to the nozzle scanning direction in FIG. 14. The linear nozzle is moved from the left to the right in FIG. 14. In this case, after the puddle is formed, the supplied developer moves from the right to the left in FIG. 14. Therefore, the developer maintaining the alkaline concentration reaches the position Pb and the hole diameter becomes large.

Figure 15A:
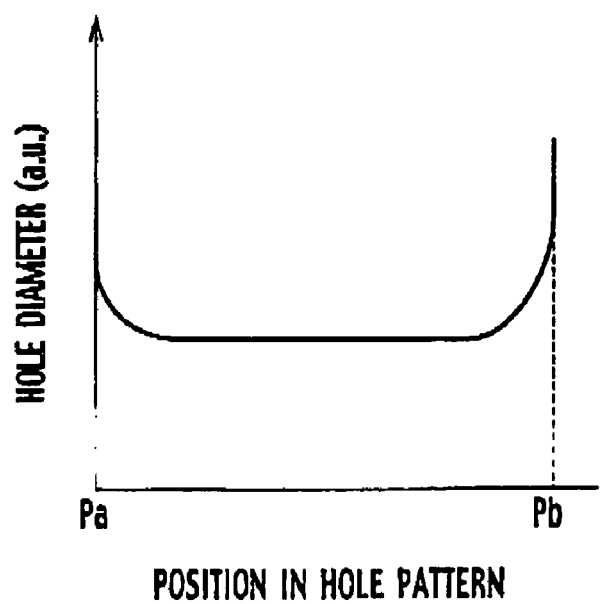
FIG. 15A is a graph that illustrates a hole diameter with non-corrected photo mask relating to a position and FIG. 15B is a graph that illustrates the hole diameter with a corrected photo mask relating to the position.

With reference to FIG. 15A, the hole diameter in the position Pa is slightly larger than the diameter around the center of the hole pattern portion 25. The phenomenon is due to the affect of existing of the adjacent non-dissolved area at the initial development stage. Meanwhile, since the flow of the developer is not considered in the method for development profile simulation according to the first embodiment, the distribution of the diameter is obtained as shown in FIG. 8A and the measured diameter shown in FIG. 15A that needs to consider the flow of the developer is not predicted. Therefore, the profile simulation is executed by using H(α, β) given by the equation (14) and changing the reference position along with the time to calculate the concentration. As the result, the hole size distribution is substantially equal to actual measurement shown in FIG. 15A and the calculated pattern size is also substantially equal to the measured pattern size. As described above, when the flow of the developer occurs, it is also possible to predict the change in the pattern size due to the flow of the developer.

Consequently, in the case where the developer flows during the development process, it is possible to predict the varied pattern size in the target position under condition in which the alkaline concentration of the developer is reduced because a photosensitive resin dissolves in the reference position.

In the second embodiment, H(α,β) is used as the concentration modulation function. However, the equation (6) may be used by replacing the variables x and y with α and β. Therefore, G(α,β) given by the equation (16) is used as an alternative.

$$G(\alpha, \beta) = \int\int dx'dy' T(\alpha,\beta) \exp[-\{(\alpha-x')^2 30 (\beta-y')^2\}/k^2] \quad (16)$$

Third Embodiment

It is possible to apply the method for development profile simulation according to the first and second embodiment to optimization of mask pattern data in order to reduce projected pattern size variation. A method for mask pattern data correction using a predicted resist pattern shape in accordance with a third embodiment is described below.

Figure 16:
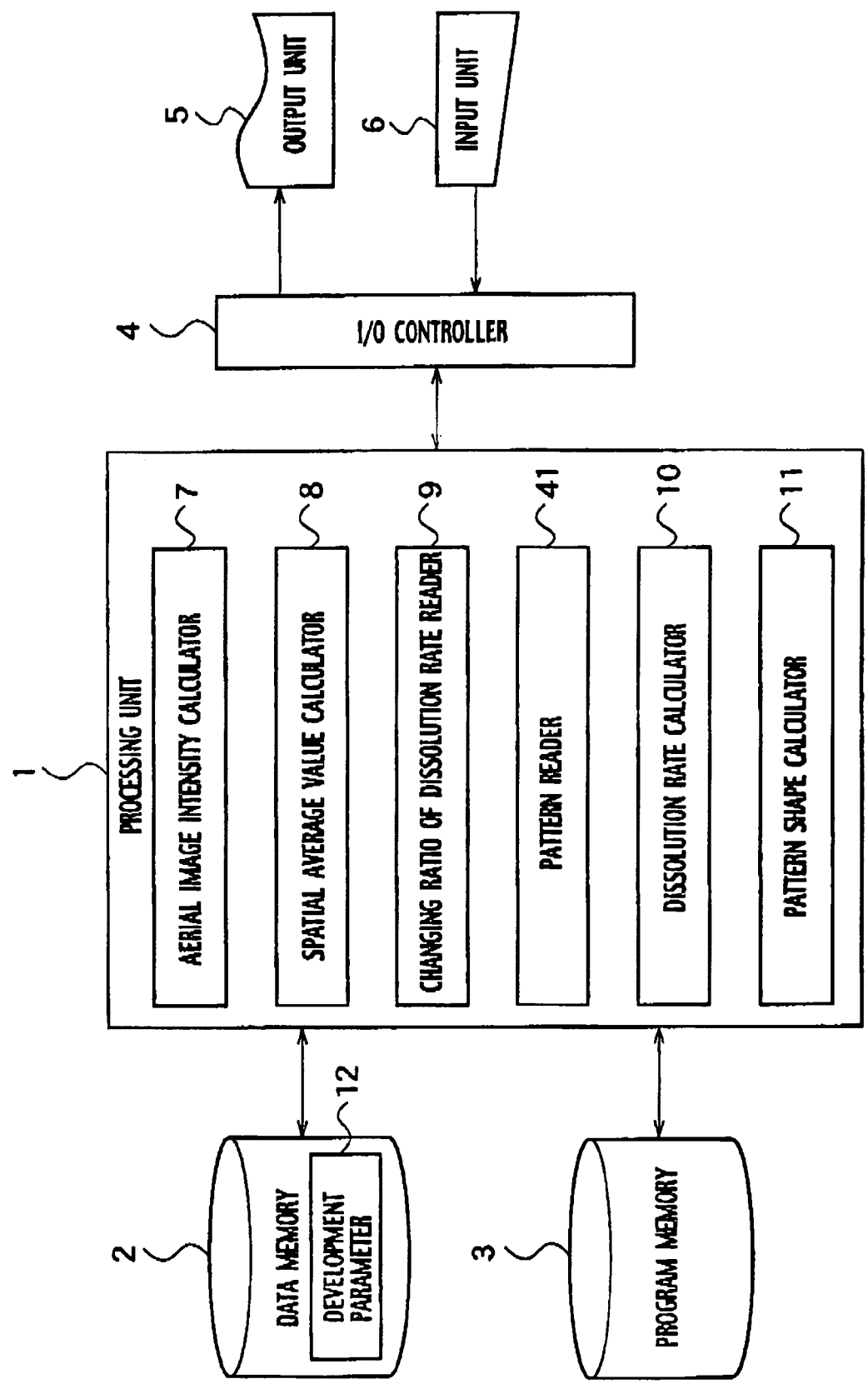
FIG. 16 is a block diagram of an apparatus for mask pattern data correction in accordance with a third embodiment of the present invention.

With reference now to FIG. 16, an apparatus for mask pattern data correction according to the third embodiment of the present invention includes a processing unit 1 having a function for performing the method for mask pattern data correction, a data memory 2 and a program memory 3 connected to the processing unit 1. The data memory 2 stores various data, such as an exposure condition, mask pattern data and a development parameter 12 which are used for mask pattern data correction. The program memory 3 stores various types of application software, middleware and an operating system that are used for mask pattern data correction.

The processing unit 1 includes an aerial image intensity calculator 7 configured to calculate an aerial image intensity of a resist, a spatial average value calculator 8 configured to calculate a spatial average value of the aerial image intensity, a changing ratio of the dissolution rate reader 9 configured to read the measured changing ratio of the dissolution rate of the resist relating to an alkaline concentration which depends on at least one of the exposure dose, the resist position in the thickness direction, and the alkaline concentration of the resist, a pattern reader 41 configured to read mask pattern data and designed pattern data in the resist, a dissolution rate calculator 10 configured to obtain a calculated dissolution rate using the spatial average value and the measured changing ratio of the dissolution rate, and a pattern shape calculator 11 configured to predict the pattern shape of the resist by using the calculated dissolution rate. The processing unit 1 is connected to an input unit 6 for receiving data and instructions entered by an operator through an I/O controller 4, and an output unit 5 for outputting the pattern shape of the resist.

With reference next to FIG. 17, the method for mask pattern data correction using the apparatus for mask pattern data correction is described below.

(a) In step S321, the designed pattern size $W_{i,0}$ (i=1, 2, 3, ..., N) in target position of the designed pattern data of the resist, size allowance δ, exposure condition, mask pattern condition including pattern arrangement and mask size included in the mask pattern data are entered in the processing unit 1. The development parameters "α" and "k", measured dissolution rate $R(c_0)$, and the measured value of the changing ratio of the dissolution rate "g" are also entered in the processing unit 1. Here, a plural mask pattern set having a different pattern arrangement and size are prepared.

(b) In step S322, the mask pattern size $M_{i,0}$ (i=1, 2, 3, ..., N) is entered in the aerial image intensity calculator 7. Thereafter, in step S323, the aerial image intensity calculator 7 calculates the aerial image intensity I(x, y) with the mask pattern size $M_{i,0}$ as a variable.

(c) In step 324, the spatial average value calculator 8 calculates a spatial average value G(x, y) of the aerial image intensity by the equation (6) with the calculated aerial image intensity I(x, y). In step S325, the dissolution rate calculator 10 calculates a calculated dissolution rate R(x, y) by using the spatial average value G(x, y), the measured initial dissolution rate $R(c_0)$, the measured changing ratio of the dissolution rate g, and the development parameter "α" and "k" in the reference position of the resist. Thereafter, in step S326, the pattern shape calculator 11 estimates the resist pattern shape by using the calculated dissolution rate R(x, y) and the aerial image intensity I(x, y) obtained in step S323. In step S327, the pattern shape calculator 11 calculates the calculated pattern size $W_{i,n}$ in the target position.

(d) In step S328, the pattern shape calculator 11 judges the similarity between the calculated pattern size $W_{i,n}$ and the designed pattern size $W_{i,0}$ based on the size allowance δ. Specifically, if the sum value of the squared difference between the designed pattern size $W_{i,0}$ and the calculated pattern size $W_{i,n}$ for $1^{st}$ to N-th target position represented as $\Sigma|W_{i,n}-W_{i,0}|^2$ is smaller than the squared value of the size allowance $\delta^2$, the procedure shown in FIG. 17 is terminated. When $\tau|W_{i,n}-W_{i,0}|^2$ is equal to or larger than the squared value of the size allowance $\delta^2$, it is determined that the mask pattern size $M_{i,0}$ entered in step S322 does not reproduce the designed pattern size of the designed resist pattern data on the resist. In this case, step S329 is the next procedure.

(e) In step S329, the pattern shape calculator 11 changes mask pattern set. Specifically, the mask pattern size $M_{i,n}$ is replaced with $M_{i,n+1}$. Thereafter, the processes from steps S322 to S328 are repeated with the replaced mask pattern size. In step S330, the mask pattern data is corrected by using the optimum mask pattern size $M_{i,n}$.

As described above, by searching for the parameter set of mask pattern minimizing the $\Sigma|W_{i,n}-W_{i,0}|^2$ which is sum value of the squared difference between the designed pattern size $W_{i,0}$ and the calculated pattern size $W_{i,n}$, it is possible to optimize the mask pattern size and fabricate the optimized mask pattern. It should be noted that the concentration M(x, y) of photoreaction products is an alternative for the aerial image intensity I(x, y) in the method for mask pattern data correction.

Since the method for mask pattern data correction makes it possible to reduce the pattern size variation depending on the development process, the desirable resist pattern shape is accurately formed on the resist.

Figure 15B:
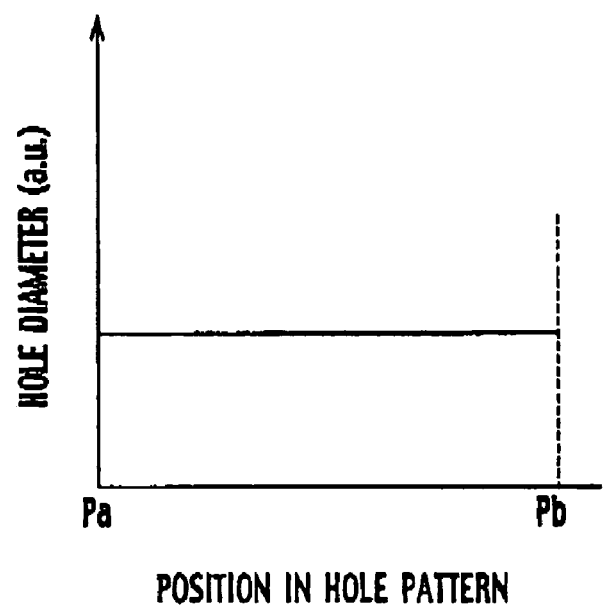

With reference again to FIG. 7, it is possible to reduce the difference between the hole diameter in the central region and one in Pa and Pb with the method for mask pattern data correction. In this case, the hole diameter in the central region is calculated by the profile simulation and the calculated hole diameter is used as the designed pattern size $W_{i,0}$. After the calculated pattern size $W_{i,n}$ of each hole pattern located on peripheral region is obtained, the mask pattern size $M_{i,n}$ corresponding to the hole pattern located on peripheral region is optimized. By using the optimized mask pattern data, the optimized mask is fabricated. Without optimizing the mask pattern, the hole diameter in the peripheral region is larger than the hole diameter in the central area, as shown in FIG. 15A. However, by using the method for mask pattern data correction according to the third embodiment, it is possible to obtain uniform hole diameter independent of the region, as shown in FIG. 15B.

In the method shown in FIG. 17, the mask pattern size $M_{i,n}$ is optimized until $\Sigma|W_{i,n}-W_{i,0}|^2$ is smaller than the squared value of size allowance $\delta^2$. However, so long that the $\Sigma|W_{i,n}-W_{i,0}|^2$ is minimized, a method is not limited to that shown in FIG. 17. As the method shown in FIGS. 5 and 11, when $\Sigma|W_{i,n}-W_{i,0}|^2$ is smaller than the squared size allowance value $\delta^2$, defining $\delta=(\Sigma|W_{i,n}-W_{i,0}|^2)^{1/2}$ as a new size allowance and repeating the judgment of the similarity between the calculated pattern size $W_{i,n}$ and the designed pattern size $W_{i,0}$ with all prepared mask pattern $M_{i,n}$ is an alternative.

In the first embodiment, the method for development profile simulation to predict the difference between the hole diameter in the central region and one in the peripheral region Pa, Pb shown in FIG. 7 and FIG. 8A is described. The method for mask pattern data correction according to the third embodiment makes it possible to reduce the difference by changing the mask pattern size.

Other Embodiments

Although the invention has been described above by reference to the embodiment of the present invention, the present invention is not limited to the embodiment described above. Modifications and variations of the embodiment described above will occur to those skilled in the art, in the light of the above teachings.

The method for development profile simulation according to the first and second embodiment makes it possible to predict the pattern size variation occurred in the development process. Further, since the method for development profile simulation predicts the pattern size in the target position, it is possible to predict the distribution of the variation of the pattern size on a wafer or an LSI chip. Therefore, it is possible to determine whether the variation of the predicted pattern size is allowable or not.

Further, the method for development profile simulation according to the first and second embodiment is useful for selecting the condition of lithography process prior to actual fabrication. In this case, the parameter set defined in step S104 shown in FIG. 5 includes not only the mask pattern size but also the exposure condition such as NA, σ and the illumination condition. Using the parameter of the exposure condition increases the precision of the predicted pattern size.

The method for development profile simulation according to the first and second embodiment is also useful for selecting the resist. The method for development profile simulation makes it possible to select the optimum resist from the plural types of resist depending on the type of the semiconductor device or the type of a lamination layer. By preparing the table containing the measured changing ratio of the dissolution rate "g" for the plural type of the resist, it is possible to select the optimum resist. Though actually manufacturing masks over and over requires a great deal of labor, time and costs, the method for development profile simulation selects the optimum resist worth using for manufacturing. Therefore, it is possible to reduce development time.

It should be noted that the term of "optical image" means the projection image formed on wafer by light in narrow sense. However, the optical image means both the projection image and a latent image in the broad sense. In the first and second embodiment, the term of the optical image means the projection image. However, the latent image is available instead of the projection image. Especially, the term of the optical image in the following claims includes both the projection image and the latent image.

As described above, the present invention includes many variations of embodiments. Therefore, the scope of the invention is defined with reference to the following claims.

What is claimed is:

1. A method for development profile simulation comprising:
   preparing an actual dissolution rate of a photosensitive resist developed by a developer, the actual dissolution rate being measured outside a computer;
   calculating optical intensities in the photosensitive resist;
   calculating a spatial average value of the optical intensities;
   calculating a changing ratio of the measured dissolution rate relating to an alkaline concentration of the developer, depending on at least one of exposure dose on the photosensitive resist, a position in a thickness direction of the photosensitive resist and the alkaline concentration of the developer;
   obtaining a calculated dissolution rate by using the spatial average value and the changing ratio;
   predicting a pattern shape of the photosensitive resist from the calculated dissolution rate; and
   storing the predicted pattern shape in a memory,
   wherein the changing ratio is calculated from a logarithm of the measured dissolution rate to the alkaline concentration.

2. The method of claim 1, wherein the optical intensities are aerial image intensities.

3. The method of claim 1, wherein each of the optical intensities are concentrations of photoreaction products.

4. A method for development of a profile simulation comprising:
   preparing an actual dissolution rate of a photosensitive resist developed by a developer, the actual dissolution rate being measured outside a computer;
   calculating optical intensities in the photosensitive resist;
   calculating a spatial average value of the optical intensities;
   calculating a changing ratio of the measured dissolution rate relating to an alkaline concentration of the developer, depending on at least one of exposure dose on the photosensitive resist, a position in a thickness direction of the photosensitive resist and the alkaline concentration of the developer;
   obtaining a calculated dissolution rate by using the spatial average value and the changing ratio;
   predicting a pattern shape of the photosensitive resist from the calculated dissolution rate; and
   storing the predicted pattern shape in a memory, wherein the changing ratio is calculated from a logarithm of the measured dissolution rate to a logarithm of the alkaline concentration.

5. The method of claim 1, wherein the spatial average value is calculated in a part of a whole exposed area where the photosensitive resist is exposed in a certain amount or more and dissolves in an initial stage of development.

6. The method of claim 1, wherein the spatial average value is calculated in reference positions of the photosensitive resist when the developer flows on the photosensitive resist, the reference positions being located upstream of the position where the pattern shape of the photosensitive resist is predicted.

7. A method for development profile simulation comprising:
   preparing an actual dissolution rate of a photosensitive resist developed by a developer, the actual dissolution rate being measured outside a computer;
   calculating optical intensities in the photosensitive resist;
   calculating a spatial average value of the optical intensities;
   calculating a changing ratio of a logarithm of the measured dissolution rate to an alkaline concentration of the developer or the changing ratio of the logarithm of the measured dissolution rate to a logarithm of the alkaline concentration of the developer;
   obtaining a calculated dissolution rate by using the spatial average value and the changing ratio of the logarithm of the measured dissolution rate to the alkaline concentration of the developer or the changing ratio of the logarithm of the measured dissolution rate to the logarithm of the alkaline concentration of the developer;
   predicting a pattern shape of the photosensitive resist by using the calculated dissolution rate; and
   storing the predicted pattern shape in a memory.

8. The method of claim 7, wherein the optical intensities are aerial image intensities.

9. The method of claim 7, wherein the optical intensities are concentrations of photoreaction products.

10. The method of claim 7, wherein the spatial average value is calculated in a part of a whole exposed area where the photosensitive resist is exposed in a certain amount or more and dissolves in an initial stage of development.

11. The method of claim 7, wherein the spatial average value is calculated in reference positions of the photosensitive resist when the developer flows on the photosensitive resist, the reference positions being located upstream of the position where the pattern shape of the photosensitive resist is predicted.

12. A method for development profile simulation comprising:
    preparing an actual dissolution rate of a photosensitive resist developed by a developer, the actual dissolution rate being measured outside a computer;
    calculating optical intensities in the photosensitive resist;
    calculating a spatial average value of the optical intensities in a part of a whole exposed area where the photosensitive resist is exposed in a certain amount or more and dissolves in an initial stage of development;
    calculating a changing ratio of the measured dissolution rate relating to an alkaline concentration of the developer;
    obtaining a calculated dissolution rate by using the spatial average value and the changing ratio;
    predicting a pattern shape of the photosensitive resist by using the calculated dissolution rate; and
    storing the predicted pattern shape in a memory.

13. The method of claim 12, wherein the optical intensities are aerial image intensities.

14. The method of claim 12, wherein the optical intensities are concentrations of photoreaction products.

15. The method of claim 12, wherein the changing ratio is calculated from the logarithm of a measured dissolution rate to the alkaline concentration.

16. The method of claim 12, wherein the changing ratio is calculated from a logarithm of the measured dissolution rate to a logarithm of the alkaline concentration.

17. The method of claim 12, wherein the spatial average value is calculated in reference positions of the photosensitive resist when the developer flows on the photosensitive resist, the reference positions being located upstream of the position where the pattern shape of the photosensitive resist is predicted.

18. A method for development profile simulation comprising:
- preparing an actual dissolution rate of a photosensitive resist developed by a developer, the actual dissolution rate being measured outside a computer;
- calculating optical intensities in a target position to predict a pattern shape of the photosensitive resist and in reference positions of the photosensitive resist, the reference positions being located upstream of the target position when the developer flows on the photosensitive resist;
- calculating spatial average values of the optical intensities in the reference positions;
- calculating a changing ratio of the measured dissolution rate relating to an alkaline concentration of the developer;
- obtaining calculated dissolution rates by using the spatial average values in the reference positions and the changing ratio;
- predicting the pattern shape of the photosensitive resist in the target position by using the calculated dissolution rates and the optical intensities in the target position; and storing the predicted pattern shape in a memory.

19. The method of claim 18, wherein the optical intensities are aerial image intensities.

20. The method of claim 18, wherein the optical intensities are concentrations of photoreaction products.

21. The method of claim 18, wherein the changing ratio is calculated from a logarithm of the measured dissolution rate to the alkaline concentration.

22. The method of claim 18, wherein the changing ratio is calculated from a logarithm of the measured dissolution rate to a logarithm of the alkaline concentration.

23. The method of claim 18, wherein the spatial average value is calculated in a part of a whole exposed area where the photosensitive resist is exposed in a certain amount or more and dissolves in an initial stage of development.

24. A computer program product for controlling a computer system so as to simulate a development profile, the computer program product comprising:
- a recording medium readable by the computer system;
- instructions recorded on the recording medium for directing the computer system to prepare an actual dissolution rate of a photosensitive resist developed by a developer, the actual dissolution rate being measured outside the computer system;
- instructions recorded on the recording medium for directing the computer system to calculate optical intensities in the photosensitive resist;
- instructions recorded on the recording medium for directing the computer system to calculate a spatial average value of the optical intensities;
- instructions recorded on the recording medium for directing the computer system to calculate a changing ratio of the measured dissolution rate relating to an alkaline concentration of the developer, depending on at least one of exposure dose on the photosensitive resist, a position in a thickness direction of the photosensitive resist and the alkaline concentration of the developer;
- instructions recorded on the recording medium for directing the computer system to obtain a calculated dissolution rate by using the spatial average value and the changing ratio;
- instructions recorded on the recording medium for directing the computer system to predict a pattern shape of the photosensitive resist from the calculated dissolution rate; and
- instructions recorded on the recording medium for directing the computer system to store the predicted pattern shape in a memory,
- wherein the changing ratio is calculated from a logarithm of the measured dissolution rate to the alkaline concentration.

25. A computer program product for controlling a computer system so as to simulate a development profile, the computer program product comprising:
- a recording medium readable by the computer system;
- instructions recorded on the recording medium for directing the computer system to prepare an actual dissolution rate of a photosensitive resist developed by a developer, the actual dissolution rate being measured outside the computer system;
- instructions recorded on the recording medium for directing the computer system to calculate optical intensities in the photosensitive resist;
- instructions recorded on the recording medium for directing the computer system to calculate a spatial average value of the optical intensities;
- instructions recorded on the recording medium for directing the computer system to calculate a changing ratio of a logarithm of a measured dissolution rate to an alkaline concentration of the developer or the changing ratio of the logarithm of the measured dissolution rate to a logarithm of the alkaline concentration of the developer;
- instructions recorded on the recording medium for directing the computer system to obtain a calculated dissolution rate by using the spatial average value and the changing ratio of the logarithm of the measured dissolution rate to the alkaline concentration of the developer or the changing ratio of the logarithm of the measured dissolution rate to the logarithm of the alkaline concentration of the developer;
- instructions recorded on the recording medium for directing the computer system to predict a pattern shape of the photosensitive resist by using the calculated dissolution rate; and
- instructions recorded on the recording medium for directing the computer system to store the predicted pattern shape in a memory.

26. A computer program product for controlling a computer system so as to simulate a development profile, the computer program product comprising:
- a recording medium readable by the computer system;
- instructions recorded on the recording medium for directing the computer system to prepare an actual dissolution rate of a photosensitive resist developed by a developer, the actual dissolution rate being measured outside the computer system;
- instructions recorded on the recording medium for directing the computer system to calculate optical intensities in the photosensitive resist;
- instructions recorded on the recording medium for directing the computer system to calculate a spatial average value of optical intensities in a part of a whole exposed area where the photosensitive resist is exposed in a certain amount or more and dissolves in an initial stage of development;
- instructions recorded on the recording medium for directing the computer system to calculate a changing ratio of the measured dissolution rate relating to an alkaline concentration of the developer;

instructions recorded on the recording medium for directing the computer system to obtain a calculated dissolution rate by using the spatial average value and the changing ratio;

instructions recorded on the recording medium for directing the computer system to predict a pattern shape of the photosensitive resist by using the calculated dissolution rate; and instructions recorded on the recording medium for directing the computer system to store the predicted pattern shape in a memory.

27. A computer program product for controlling a computer system so as to simulate a development profile, the computer program product comprising:

a recording medium readable by the computer system;

instructions recorded on the recording medium for directing the computer system to prepare an actual dissolution rate of a photosensitive resist developed by a developer, the actual dissolution rate being measured outside the computer system;

instructions recorded on the recording medium for directing the computer system to calculate optical intensities in a target position to predict a pattern shape of the photosensitive resist and in reference positions of the photosensitive resist, the reference positions being located upstream of the target position when the developer flows on the photosensitive resist;

instructions recorded on the recording medium for directing the computer system to calculate spatial average values of the optical intensities in the reference positions;

instructions recorded on the recording medium for directing the computer system to calculate a changing ratio of the measured dissolution rate relating to an alkaline concentration of the developer;

instructions recorded on the recording medium for directing the computer system to obtain calculated dissolution rates by using the spatial average values in the reference positions and the changing ratio;

instructions recorded on the recording medium for directing the computer system to predict the pattern shape of the photosensitive resist in the target position by using the calculated dissolution rates and the optical intensities in the target position; and instructions recorded on the recording medium for directing the computer system to store the predicted pattern shape in a memory.

28. A method for mask pattern data correction comprising:

preparing an actual dissolution rate of a photosensitive resist developed by a developer, the actual dissolution rate being measured outside a computer;

reading a designed pattern data in the photosensitive resist and a mask pattern data;

calculating a changing ratio of the measured dissolution rate relating to an alkaline concentration of the developer, depending on at least one of exposure dose on the photosensitive resist, a position in the thickness direction of the photosensitive resist and an alkaline concentration of the developer;

calculating optical intensities in the photosensitive resist by using the mask pattern data;

calculating a spatial average value of the optical intensities;

obtaining a calculated dissolution rate by using the spatial average value and the changing ratio;

predicting a pattern shape of the photosensitive resist from the calculated dissolution rate;

optimizing the mask pattern data so as to make the calculated pattern shape similar to the designed pattern data in the photosensitive resist; and storing the optimized mask pattern data in a memory, wherein the changing ratio is calculated from a logarithm of the measured dissolution rate to the alkaline concentration.

29. A method for mask pattern data correction comprising:

preparing an actual dissolution rate of a photosensitive resist developed by a developer, the actual dissolution rate being measured outside a computer;

obtaining a designed pattern data in the photosensitive resist and a mask pattern data;

calculating a changing ratio of a logarithm of the measured dissolution rate to an alkaline concentration of the developer or the changing ratio of the logarithm of the measured dissolution rate to a logarithm of the alkaline concentration of the developer;

calculating optical intensities in the photosensitive resist by using the mask pattern data;

calculating a spatial average value of the optical intensities;

obtaining a calculated dissolution rate by using the spatial average value and the changing ratio;

predicting a pattern shape of the photosensitive resist from the calculated dissolution rate;

optimizing the mask pattern data so as to make the calculated pattern shape similar to the designed pattern data in the photosensitive resist; and storing the optimized mask pattern data in a memory.

30. A method for mask pattern data correction comprising:

preparing an actual dissolution rate of a photosensitive resist developed by a developer, the actual dissolution rate being measured outside a computer;

reading a designed pattern data in the photosensitive resist and a mask pattern data;

calculating a changing ratio of the measured dissolution rate relating to an alkaline concentration of the developer;

calculating optical intensities in the photosensitive resist by using the mask pattern data;

calculating a spatial average value of optical intensities in a part of a whole exposed area where the photosensitive resist is exposed in a certain amount or more and dissolves in an initial stage of development;

obtaining a calculated dissolution rate by using the spatial average value and the changing ratio;

predicting a pattern shape of the photosensitive resist from the calculated dissolution rate;

optimizing the mask pattern data so as to make the calculated pattern shape similar to the designed pattern data in the photosensitive resist; and storing the optimized mask pattern data in a memory.

31. A method for mask pattern data correction comprising:

preparing an actual dissolution rate of a photosensitive resist developed by a developer, the actual dissolution rate being measured outside a computer;

reading a designed pattern data in the photosensitive resist and a mask pattern data;

calculating a changing ratio of the measured dissolution rate relating to an alkaline concentration of the developer;

calculating optical intensities in a target position of the photosensitive resist and in reference positions of the photosensitive resist by using the mask pattern data, the reference positions being located upstream of the target position when the developer flows on the photosensitive resist moving along development time;

calculating a spatial average value of the optical intensities in the reference positions;

obtaining a calculated dissolution rate by using the spatial average value in the reference positions and the changing ratio;

predicting a pattern shape of the photosensitive resist by using the calculated dissolution rate and the optical intensities in the target position;

optimizing the mask pattern data so as to make the calculated pattern shape similar to the designed pattern data in the photosensitive resist; and storing the optimized mask pattern data in a memory.

* * * * *

UNITED STATES PATENT AND TRADEMARK OFFICE
CERTIFICATE OF CORRECTION

PATENT NO. : 7,319,944 B2 Page 1 of 1
APPLICATION NO. : 10/760522
DATED : January 15, 2008
INVENTOR(S) : Nakamura et al.

It is certified that error appears in the above-identified patent and that said Letters Patent is hereby corrected as shown below:

Title page, item (54), in the title, line 1, change "FOR A PREDICTING" to --FOR PREDICTING-- and Col. 1, line 1, change "For A Predicting" to --For Predicting--

\* Claim 29, column 32, lines 32-33, change "pattern, data" to --pattern data--.

Signed and Sealed this

Twenty-seventh Day of May, 2008

JON W. DUDAS
*Director of the United States Patent and Trademark Office*